(12) United States Patent
Goh

(10) Patent No.: US 10,438,882 B2
(45) Date of Patent: *Oct. 8, 2019

(54) INTEGRATED CIRCUIT PACKAGE WITH MICROSTRIP ROUTING AND AN EXTERNAL GROUND PLANE

(71) Applicant: Intel Corporation, Santa Clara, CA (US)

(72) Inventor: Eng Huat Goh, Penang (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/473,317

(22) Filed: Mar. 29, 2017

(65) Prior Publication Data

US 2018/0286797 A1 Oct. 4, 2018

(51) Int. Cl.
*H01L 23/498* (2006.01)
*H01L 21/48* (2006.01)
(Continued)

(52) U.S. Cl.
CPC ...... *H01L 23/49838* (2013.01); *H01L 21/481* (2013.01); *H01L 21/486* (2013.01); *H01L 21/4853* (2013.01); *H01L 21/4871* (2013.01); *H01L 23/4924* (2013.01); *H01L 23/49811* (2013.01); *H01L 23/49827* (2013.01); *H01L 23/50* (2013.01); *H01L 23/66* (2013.01); *H01L 24/16* (2013.01); *H01L 24/32* (2013.01); *H01L 24/73* (2013.01); *H01L 24/92* (2013.01); *H01L 2223/6627* (2013.01); *H01L 2223/6655* (2013.01); *H01L 2224/16227* (2013.01); *H01L 2224/32225* (2013.01);
(Continued)

(58) Field of Classification Search
CPC ......... H01L 24/34; H01L 24/38; H01L 24/41; H01L 23/5286; H01L 23/49838; H01L 2223/6627
See application file for complete search history.

(56) References Cited

U.S. PATENT DOCUMENTS 5,723,954 A * 3/1998 Sampayan ............. B82Y 10/00
257/10
6,166,692 A * 12/2000 Nalbandian .......... H01Q 9/0414
343/700 MS
(Continued)

*Primary Examiner* — David A Zarneke
(74) *Attorney, Agent, or Firm* — Patent Capital Group

(57) ABSTRACT

Described herein are integrated circuit structures having a package substrate with microstrip transmission lines as the top metallization layer, and a ground plane external to the package substrate that is electrically connected to a ground plane internal to the package substrate, as well as related devices and methods. In one aspect of the present disclosure, an integrated circuit structure may include a package substrate having an internal ground plane and a microstrip signal layer as the top metallization layer, and an external ground plane on the surface of the package substrate that is electrically connected to the internal ground plane in the package substrate. In another aspect of the present disclosure, an integrated circuit structure may further include changes to microstrip transmission line geometry to match impedance values of areas covered by the external ground plane with impedance values of areas not covered by the external ground plane.

13 Claims, 9 Drawing Sheets

(51) Int. Cl.
 *H01L 23/50* (2006.01)
 *H01L 23/492* (2006.01)
 *H01L 23/66* (2006.01)
 *H01L 23/00* (2006.01)

(52) U.S. Cl.
 CPC ............. *H01L 2224/73204* (2013.01); *H01L 2224/92125* (2013.01); *H01L 2224/97* (2013.01); *H01L 2924/15311* (2013.01); *H01L 2924/3511* (2013.01)

(56) References Cited

U.S. PATENT DOCUMENTS

| | | | |
|---|---|---|---|
| 6,181,278 B1 * | 1/2001 | Kakimoto | H01Q 9/0457 333/247 |
| 6,495,446 B1 * | 12/2002 | Tsai | H01L 21/76838 257/E21.582 |
| 6,531,932 B1 | 3/2003 | Govind et al. | |
| 7,459,782 B1 | 12/2008 | Li | |
| 8,952,511 B2 * | 2/2015 | Sathe | H05K 3/303 257/678 |
| 9,041,205 B2 * | 5/2015 | Karhade | H01L 23/538 257/690 |
| 9,502,368 B2 | 11/2016 | Tomita et al. | |
| 9,515,031 B2 | 12/2016 | Altunyurt et al. | |
| 9,972,589 B1 * | 5/2018 | Goh | H01L 23/66 |
| 2002/0079572 A1 * | 6/2002 | Khan | H01L 23/3677 257/707 |
| 2003/0111726 A1 * | 6/2003 | Khan | H01L 23/13 257/730 |
| 2015/0380343 A1 * | 12/2015 | Koontz | H01L 21/4825 257/621 |
| 2016/0056055 A1 * | 2/2016 | Ko | H01L 23/562 438/107 |
| 2016/0095209 A1 | 3/2016 | Starkston et al. | |
| 2016/0268213 A1 | 9/2016 | Jiang et al. | |
| 2018/0033741 A1 * | 2/2018 | Dubey | H01L 23/498 |

* cited by examiner

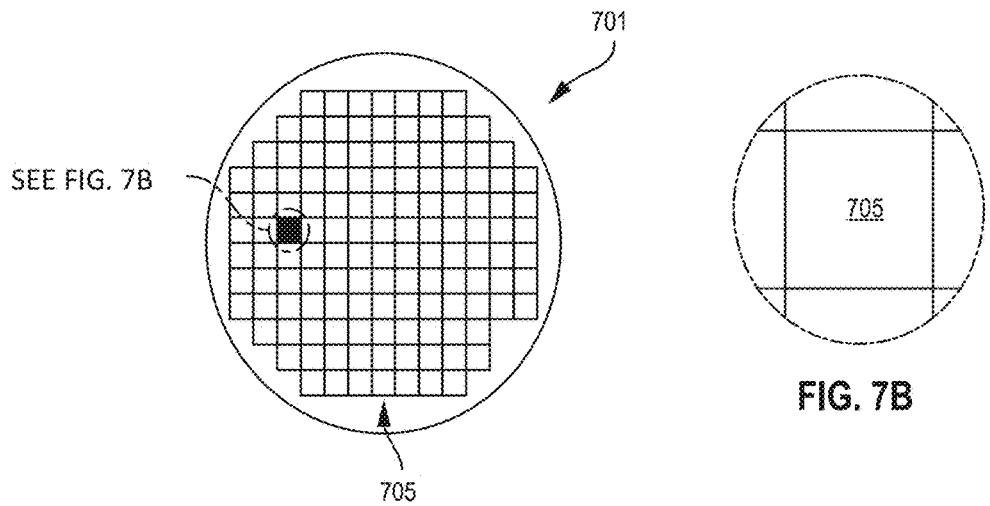
FIG. 7A
FIG. 7B
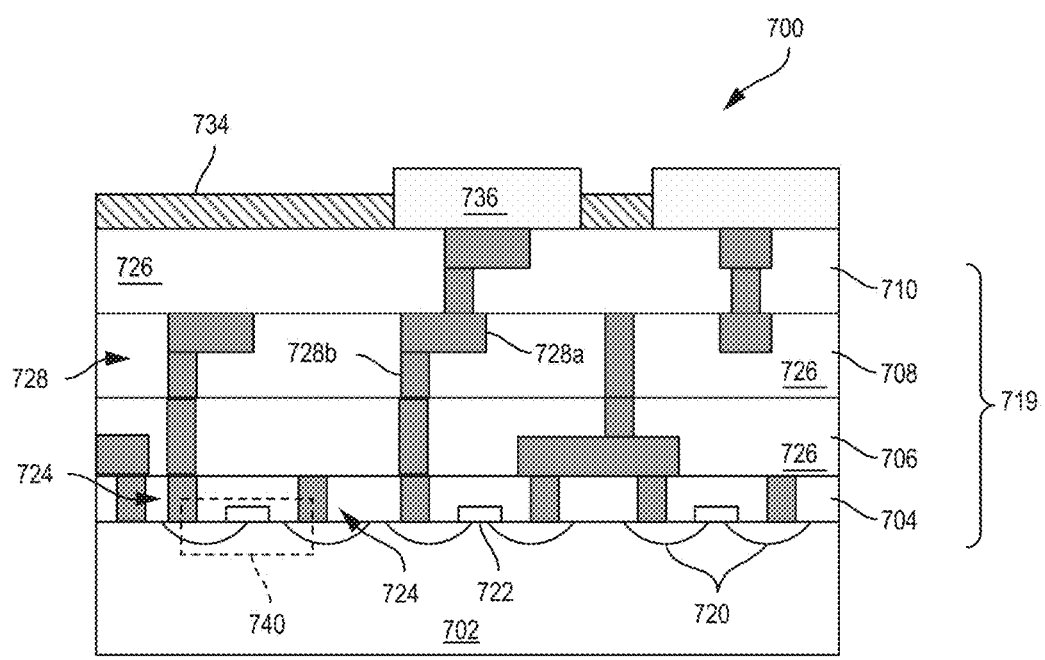
FIG. 7C

US 10,438,882 B2

INTEGRATED CIRCUIT PACKAGE WITH MICROSTRIP ROUTING AND AN EXTERNAL GROUND PLANE

FIELD

This disclosure relates generally to the field of semiconductor packages and, in particular, methods and apparatuses for semiconductor packages with improved electrical performance.

BACKGROUND

Semiconductor dies are routinely connected to larger circuit boards such as motherboards and other types of printed circuit boards (PCBs) via a package substrate. A package substrate typically has two sets of connection points, a first set for connection to the die or multiple dies and a second less densely-packed set for connection to the PCB. A package substrate generally consists of an alternating sequence of a plurality of organic insulation or dielectric layers and a plurality of patterned electrically conductive layers forming traces between the insulation layers. Stripline and microstrip are two common integrated circuit designs for package substrates. Stripline architecture has a signal line layer sandwiched between two ground planes. Microstrip architecture only has a ground plane below the signal line layer. In most applications, stripline is preferred over microstrip as it has lower crosstalk, even though it requires an additional layer. Continued advancements in integrated circuit technology have resulted in the need for package substrates having fewer layers, higher electrical performance, and lower crosstalk.

BRIEF DESCRIPTION OF THE DRAWINGS

Embodiments described herein illustrated by way of example and not limitation in the figures of the accompanying drawings, in which like references indicate similar features. The following figures are illustrative, and other processing techniques or stages can be used in accordance with the subject matter described herein. The accompanying drawings are not necessarily drawn to scale. Furthermore, some conventional details have been omitted so as not to obscure from the inventive concepts described herein.

FIGS. 7A and 7B are top views of a wafer and dies that may be used with any of the embodiments of the IC structures disclosed herein.

FIG. 7C is a cross-sectional side view of an integrated circuit device that may be used with any of the embodiments of the integrated circuit structures disclosed herein.

DETAILED DESCRIPTION

Figure 1:
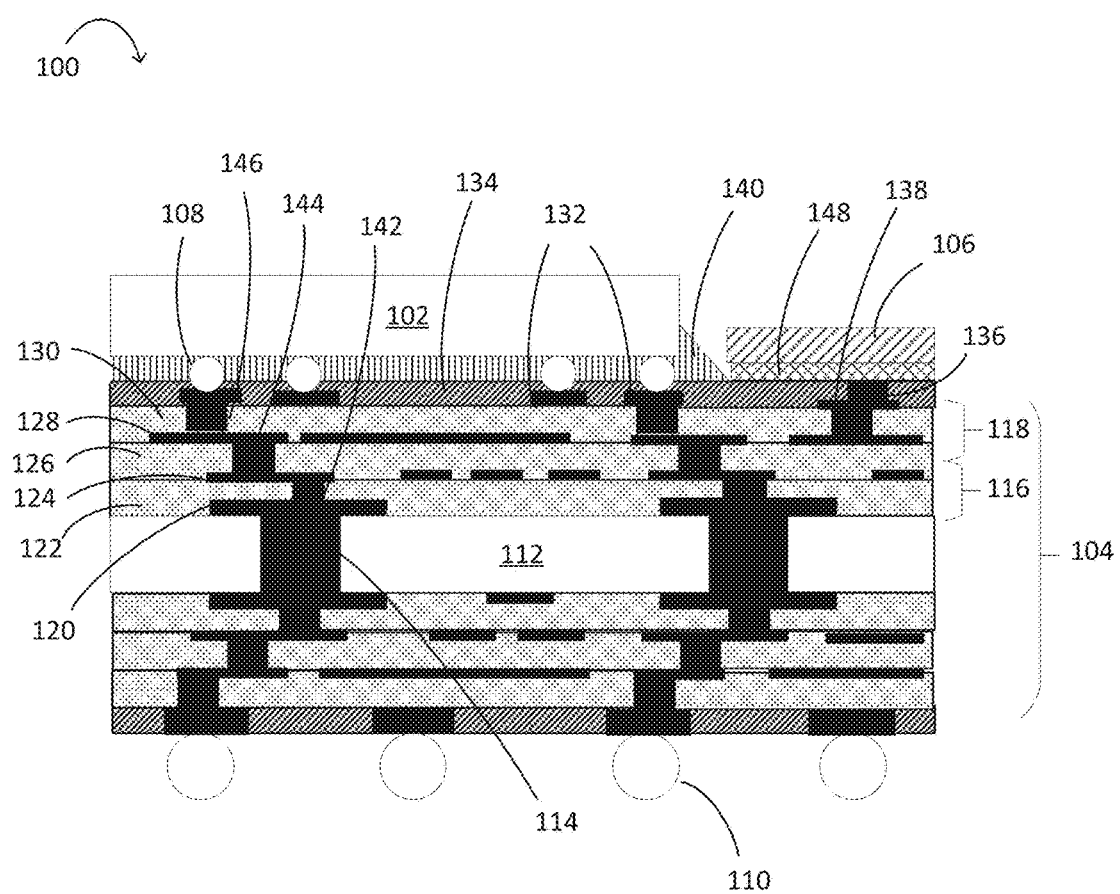
FIG. 1 is a schematic illustration of an example integrated circuit package, according to some embodiments of the present disclosure.

Integrated circuit structures with a package substrate having microstrip transmission lines as the top metallization layer, and a ground plane external to the package substrate that is electrically connected to a ground plane internal to the package substrate, as well as related structures, devices, and methods, are disclosed herein. In some embodiments, an integrated circuit structure may include a package substrate having an internal ground plane and a microstrip signal layer as the top metallization layer, and an external ground plane on the surface of the package substrate that is electrically connected to the internal ground plane in the package substrate. In some embodiments, a package substrate may further include a dielectric layer and a solder resist layer. In some embodiments, an integrated circuit structure may further include a die, first level interconnects, a package substrate having an internal ground plane, a dielectric layer and a microstrip signal layer as the top metallization layer, and an external ground plane on the surface of the package substrate that is electrically connected to the internal ground plane in the package substrate. In another example, an integrated circuit structure may include changes to microstrip transmission line geometry to match impedance values of areas underneath or covered by the external ground plane with impedance values of areas not covered by the external ground plane.

Conventional microstrip circuit architecture includes a substrate, a ground plane structure disposed over the substrate, a dielectric layer disposed over the ground plane structure, and a conductor strip structure (i.e. a strip of a conductive material or a superconducting material) disposed over the dielectric layer. In such an arrangement, there is a single ground plane for a given conductor strip and the conductor strip is separated from the ground plane by the dielectric layer. Such a transmission line may be referred to as a "microstrip line."

Conventional stripline circuit architecture includes a substrate, a lower ground plane disposed over the substrate, a lower dielectric layer disposed over the lower ground plane, a conductor strip disposed over the lower dielectric layer, an upper dielectric layer disposed over the conductor strip, and an upper ground plane disposed over the upper dielectric layer. In such an arrangement, there are two ground planes for a given conductor strip and the conductor strip is separated from each ground plane by a respective dielectric layer (i.e. a conductor strip is provided in between, or sandwiched by, the two ground planes). Such a transmission line may be referred to as a "stripline."

A package substrate may have multiple microstrip and stripline architectures stacked on top of each other to form the package substrate build up layers. In such architectures, the upper ground plane layer of a stripline structure may function as the lower ground plane layer of a next microstrip or stripline structure stack, and the upper dielectric layer may function as the substrate on which the next ground plane layer is deposited.

High performance electronic products typically incorporate stripline routing rather than microstrip routing as stripline routing provides superior far-end crosstalk performance, e.g., reduced cross-talk, and high thermomechanical reliability. From an electrical performance perspective, the superiority of stripline transmission lines may be due at least in part to the phenomenon that stripline configuration can support a balanced wave propagation of even and odd modes leading to theoretically zero far-end crosstalk. However, stripline performance benefits come at price due to the extra dielectric and ground layers, including increased cost to the overall package manufacturing and greater z-height, also referred to herein as thickness.

Various ones of the Integrated circuit structures described herein provide for package substrates having microstrip routing with improved far-end crosstalk performance. In particular, some of the embodiment disclosed herein provide a semiconductor package assembly including a package substrate having microstrip architecture with the signal line layer as the uppermost metallization layer and an external conductor component that is electrically coupled to the ground plane in the package substrate to create a structure where the microstrip signal line layer is sandwiched between two ground layers such that crosstalk is reduced and electrical performance is improved. Disclosed herein are integrated circuit packages including a package substrate having a microstrip line structure as the top layer, where the microstrip line structure includes an internal ground plane layer, a dielectric layer, and a microstrip transmission line layer, and an external conductive layer on top of the package substrate that is electrically connected by a via to the internal ground plane layer of the microstrip line structure. Internal ground layer may also be referred to herein as internal ground plane, and internal ground plane layer. Thus, various embodiments disclosed herein may provide an integrated circuit package where the microstrip lines are effectively sandwiched by a top and a bottom ground plane, as in the stripline structure, without adding layers to the package substrate. In various embodiments disclosed herein, the external ground layer may cover only a portion of the package substrate, for example, the external ground plane may be a metal frame that surrounds a die and acts to reduce warpage. Various embodiments disclosed herein further provide for changing transmission line geometry to correct impedance differentials that may occur between areas covered by the external ground plane layer and areas not covered by the external ground plane layer.

In the following detailed description, various aspects of the illustrative implementations are described using terms commonly employed by those skilled in the art to convey the substance of their work to others skilled in the art. For example, as used herein, a "high-k dielectric" refers to a material having a higher dielectric constant than silicon oxide. In another example, a term "interconnect" is used to describe any element formed of an electrically conductive material for providing electrical connectivity to one or more components associated with an integrated circuit (IC) or/and between various such components. In general, the "interconnect" may refer to both trenches (also sometimes referred to as "lines") and vias. In general, a term "trench" is used to describe an electrically conductive element isolated by an interconnect support layer typically comprising an interlayer low-k dielectric that is provided within the plane of an IC chip. Such trenches are typically stacked into several levels. On the other hand, the term "via" is used to describe an electrically conductive element that extends through the insulation layers and interconnects two or more trenches of different conductive layers. To that end, vias are provided substantially perpendicularly to the plane of an IC package. A via may interconnect two trenches in adjacent levels or two trenches in not adjacent levels. Typically, a microvia has a diameter less than or equal to 150 microns (um). The term "metallization stack" refers to a stack of one or more interconnects for providing connectivity to different circuit components of an IC package. As used herein, the terms "conductor strip," "interconnect," "line," "wire," "transmission line," "signal line," "trace," and "routing," may be used interchangeably to describe circuitry of the IC package.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The term "between," when used with reference to measurement ranges, is inclusive of the ends of the measurement ranges. As used herein, the notation "A/B/C" means (A), (B), and/or (C).

The terms "left," "right," "front," "upper," "lower," "back," "top," "bottom," "over," "under," "on," "between," and the like in the description and in the claims, if any, are used for descriptive purposes and not necessarily for describing permanent relative positions. For example, one layer over, or under another layer may be directly in contact with the other layer or may have one or more intervening layers. Moreover, one layer between two layers may be directly in contact with the two layers or may have one or more intervening layers. In contrast, a first layer "on" a second layer is in direct contact with that second layer. Similarly, unless explicitly stated otherwise, one feature between two features may be in direct contact with the adjacent features or may have one or more intervening layers.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

FIG. 1 is a cross-sectional view of a portion of an integrated circuit structure 100 having an external ground plane electrically coupled to an internal ground plane, in accordance with various embodiments. Assembly 100 may include an integrated circuit package having a die 102, a package substrate 104, and a conductive component 106 that is external to the package substrate and is electrically coupled to a ground plane within the package substrate. Assembly 100 may include die 102 connected to package substrate 104 having a first-level interconnect side 108 and a second-level interconnect side 110. The device side of die 102 may be coupled to package substrate 104 via first level interconnects (FLI) 108. In some embodiments, the area between die 102 and package substrate 104 may be filled with underfill 140, which may be a mold compound or any other suitable material to fill the gap between the die 102 and the package substrate 104. Underfill 140 may be applied using any suitable technique, such as transfer mold, capillary underfill, or epoxy flux as part of the thermal conductive bonding (TCB) process. In some embodiments, the underfill 140 may extend beyond the area defined by die 102. Assembly 100 may include a plurality of dies coupled to package substrate 104 or coupled to another die in a package-on-package (PoP) configuration. Package substrate 104 may be coupled to another electrical component (not shown), such as a motherboard, via second level interconnects (SLI) 110. Package substrate 104 may include electrical pathways to route signals or power between the ELI 108 and the SLI 110, as is known in the art.

Package substrate 104, as shown, may include carrier 112 (also referred to herein as substrate or core), a first metal layer 120, a first dielectric layer 122, a second metal layer 124, a second dielectric layer 126, a third metal layer 128, a third dielectric layer 130, a fourth metal layer 132, a solder resist layer 134, and conductive vias 138, 142, 144, 146 connecting the different metal layers. The multiple metal and dielectric layers are formed on both sides of carrier 112, but for simplicity, only the upper side of carrier 112 is described in detail. The description of the metallization stack on the upper side of the carrier applies equally to the metallization stack on the bottom side of carrier 112.

In some embodiments, carrier 112 may be rigid to provide a flat and stable surface to facilitate tight design rules during manufacturing, or may be, for example, an ultra-thin core (UTC) to reduce z-height. Carrier 112 may be made of any suitable material, such as stainless steel, glass, silicon, fiber-glass reinforced epoxy, among others. In some embodiments, carrier 112 may include a plated through hole (PTH) 114. In some embodiments, carrier 112 may be temporary, such that the package substrate is coreless, and may include a release layer onto which the first metal layer 120 may be deposited. The first metal layer 120 may be a foil layer and may be made of any suitable metal, for example, copper. The first metal layer 120 may be laminated on the surfaces of the carrier 112, plated, or otherwise deposited using any suitable means. In certain examples, the surfaces of the carrier 112 may include the first metal layer 120, such that the carrier may be referred to as a nickel-clad carrier when the first metal layer 120 is nickel, or may be referred to as a copper-clad carrier when the first metal layer 120 is copper, etc. Nickel and copper are advantageous metals because they are easily deposited. In some embodiments, the metal layer thickness may be between 3 um and 20 um.

Metallization sub-stack 116 may include first metal layer 120, first dielectric layer 122, second metal layer 124, second dielectric layer 126, and third metal layer 128, which is a stripline architecture where the signal layer (i.e., second metal layer 124) is sandwiched between two ground layers (i.e., first and third metal layers 120, 128). In some embodiments, the ground plane layer is continuous. In other embodiments (as shown), the ground plane layer is discontinuous.

Metallization sub-stack 118 may include third metal layer 128, third dielectric layer 130, and fourth metal layer 132, which is a microstrip architecture where the signal layer (i.e., fourth metal layer 132) is above a ground layer (i.e., third metal layer 128). A solder resist layer 134 may be deposited on the fourth metal layer and patterned to provide conductive contact points for FLI 108 and external conductive component 106.

The one or more dielectric layers 122, 126, 130 may be formed using any suitable process, including, for example, chemical vapor deposition (CVD), film lamination, slit coating and curing, atomic layer deposition (ALD), or spin on process, among others, and with any suitable material. Examples of dielectric materials that may be used include, but are not limited to, epoxy-based materials/films, ceramic/silica filled epoxide films, polyimide films, filled polyimide films, other organic materials, and other inorganic dielectric materials known from semiconductor processing as well as silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass (OSG). The one or more dielectric layers may be formed using dielectric materials known for their applicability in integrated circuit structures, such as materials having low dielectric constant (k) and/or low dielectric loss (Df). Typically, low-k films have a dielectric constant smaller than that of SiO2, which has a dielectric constant of about 4.0. Low-k films having dielectric constants of about 2.7 to about 3 are typical in current semiconductor fabrication processes. Typically, low Df films have a Df value of less than 0.004. The dielectric layers may include pores or air gaps to further reduce their dielectric constant.

In some embodiments, the thickness of dielectric layers may be increased to allow for planarization, for example, by grinding, by lapping, chemical mechanical (CMP) polishing, or by wet or dry etching. In some embodiments, the thickness of dielectric layers may be minimized to reduce the etching time required to expose the one or more vias in a subsequent processing operation. In some embodiments, dielectric layer thickness may be 3 um-30 um.

In some embodiments, electrical interconnects are formed by patterning a dielectric layer to create one or more trench or via openings that then may be filled with conductive material to form interconnects. In general, a feature used to form an electrical interconnect is a depression having any shape formed in a substrate or layer deposited on the substrate. For example, through-via conductive pathways 136, 138, 142, 144, 146 may be formed using any suitable through-via formation techniques. In some embodiments, conductive trenches or via openings may be formed by laser drilling, by conventional wet or dry etch semiconductor processing techniques, or by another suitable process. Vias may be formed on a single dielectric layer or may be formed through multiple dielectric layers, and may have contact pads on the top and bottom surfaces. In some embodiments, the through-vias may include multiple layers of conductive traces that are connected by multiple vias. The diameter of the vias may be any suitable dimension and may vary based on the I/O dimensions of the package substrate. In some embodiments, the diameter/size of the via may be 50 microns (um) to 100 um. In some embodiments, the diameter dimension of the vias may vary in size from top to bottom such that the bottom diameter size is smaller than the top diameter size.

In some embodiments, electrical interconnects may be formed by depositing and patterning photoresist using, for example, a lithography patterning process. Conductive material may be deposited into openings formed by the patterned photoresist layer to form conductive traces and pads. Conductive vias may be formed by depositing and patterning a second photoresist layer over a first photoresist layer and filling the openings with conducting material. As is known in the art, photoresist layers may be formed with any suitable process, such as lamination, and may be positively or negatively charged to create crosslinked and non-crosslinked portions using ultraviolet for patterning conductive material layer. Non-crosslinked portions dissolve to form openings where conductive material may be deposited. In some embodiments, conductive material is formed using an elytic copper plating. In some embodiments, conductive lines and pads may be formed with a copper electroplating process, sputtered copper, or the like. Although vias illustrated in FIG. 1 are shown having substantially parallel sidewalls, vias may have any profile (e.g., as dictated by the manufacturing operations used to form the vias). In some embodiments, vias have substantially vertical sidewalls. In some embodiments, vias have angled sidewalls to form conical-shaped vias.

Conductive material may be any type of conductive metal, such as copper. In some embodiments, openings may be filled with the same or different conducting materials. For example, a line may include, consist of, or consist essentially of copper (Cu) while the via may include, consist of, or consist essentially of one or more bulk materials comprising aluminum (Al), copper (Cu), tungsten (W), cobalt (Co), ruthenium (Ru), nickel (Ni), iron (Fe), and molybdenum (Mo) and/or one or more alloys comprising aluminum (Al), copper (Cu), tungsten (W), cobalt (Co), ruthenium (Ru), manganese (Mn), magnesium (Mg), boron (B), phosphorus (P), nitrogen (N), carbon (C), and sulfur (S).

Additional build-up layers in the package substrate may be constructed by laminating, curing, drilling and desmearing the dielectric layer followed by a plating process to form conductive layers or lines and conductive vias, according to known methods such as semi-additive process (SAP).

As shown in FIG. 1, conductive component 106 (also referred to herein as an external ground plane) may be attached to the package substrate using conductive adhesive 148, or by any other suitable means, including, but not limited to, solder balls, among others. Conductive component 106 may be electrically connected by vias 136, 138 to internal ground plane (i.e., third metal layer 128). Conductive component 106 may be electrically connected to the internal ground plane by a plurality of vias. Conductive component 106 may be any suitable conductor that acts as an external ground plane, such as a metal sheet or frame. In some embodiments, conductive component 106 may simply be a planar metal piece that is substantially parallel to the top surface of the package substrate. In some embodiments, conductive component 106 may be a metal stiffener that frames the die and is bonded to the package substrate. In some embodiments, conductive component 106 is continuous and covers the exposed surface of the package substrate. In some embodiments, conductive component 106 may have multiple segments and may cover only a portion of the package substrate surface.

Figure 2A:
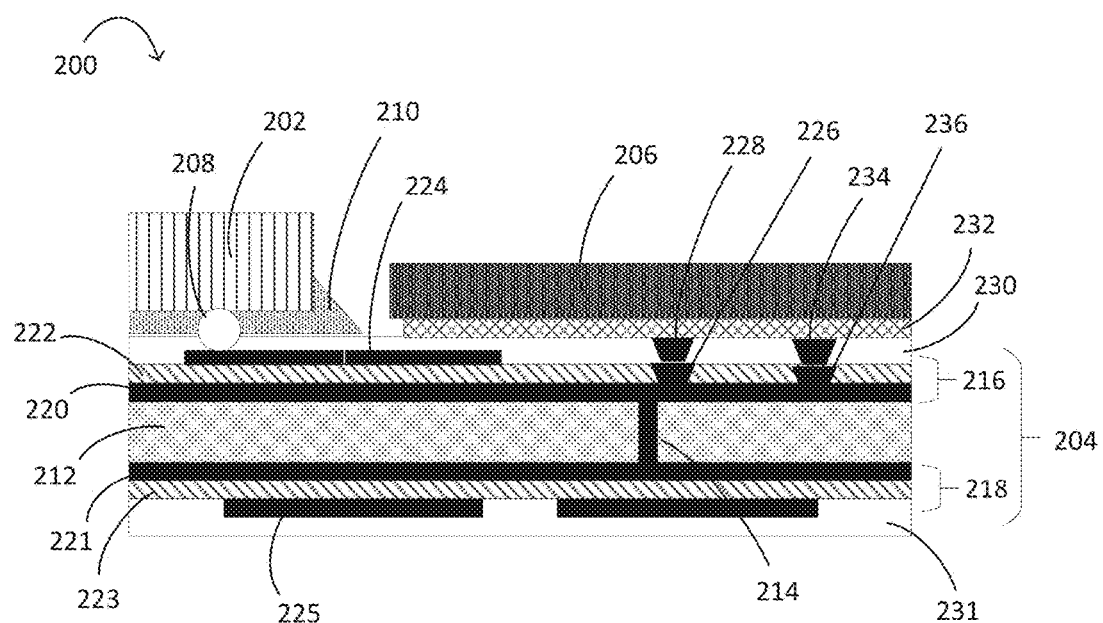
FIG. 2A is a schematic illustration of a cross-section view of an example integrated circuit package having microstrip routing and a ground plane external to the package substrate, according to some embodiments of the present disclosure.

FIG. 2A is a schematic illustration of a cross-section view of an example integrated circuit package 200 having microstrip routing and an external ground plane electrically connected to the ground plane in the package substrate. Assembly 200 may include an integrated circuit package having a die 202, a package substrate 204, and a conductive component 206 that is external to the package substrate and is electrically coupled to a ground plane within the package substrate. The device side of die 202 may be coupled to package substrate 204 via first level interconnects (FLI) 208 and the area between die 202 and package substrate 204 may be filled with underfill 210, which may be a mold compound or any other suitable material to fill the gap.

FIG. 2A shows a simplified schematic of a metallization stack having only microstrip architecture 216, 218 on both sides of substrate 212. Microstrip packages typically include a 100 microns (um) to 200 microns thick core (commonly referred to as an ultra-thin core (UTC)) with build-up layers similar to cored substrates on both sides of the core. The microstrip layers on the top side 216 and bottom side 218 of the core 212 include an internal ground plane layer 220, 221, a dielectric layer 222, 223, and a microstrip trace layer 224, 225 as the upper and lower metallization layers. As shown, the ground layer on top side of the core 220 is electrically connected to the ground layer on the bottom side of the core 221 by plated through hole 214. In some embodiments, as shown in FIG. 2A, a solder resist layer 230, 231 may be deposited over the upper and/or lower microstrip trace layers. External ground plane 206 may be electrically connected to internal ground plane 220 by vias 226, 228, 234, 236 and conductive adhesive 232.

Figure 2B:
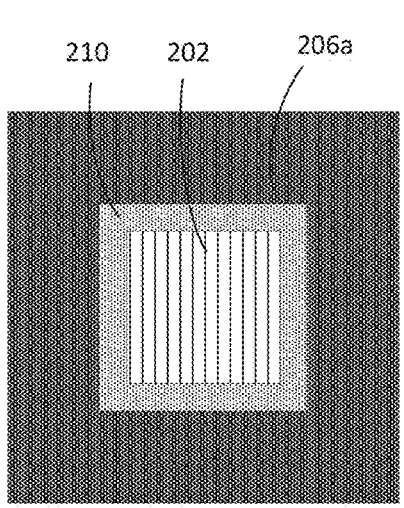
FIGS. 2B and 2C are schematic illustrations of a top plane view of an example integrated circuit package having microstrip routing and a ground plane external to the package substrate, according to some embodiments of the present disclosure.
Figure 2C:
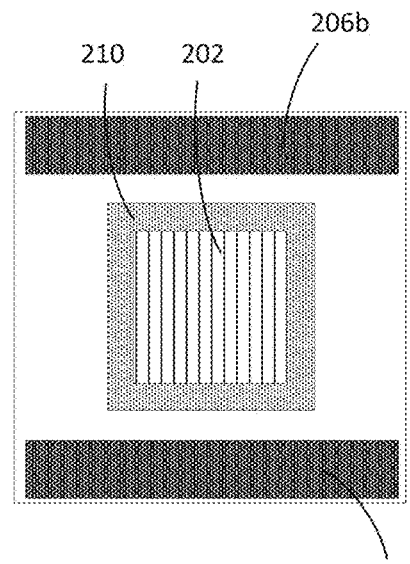

FIGS. 2B and 2C are schematic drawings of top plane views of an example integrated circuit package of FIG. 2A. FIG. 2B shows die 202, underfill 210 extending beyond the die, and external ground plane 206a, which frames die 102 and underfill 210. External ground plane 206a is offset from die 202 by underfill 210. In some embodiments, as shown in FIG. 2B, ground plane 206a is a continuous structure that covers the remaining or entire surface area of the package substrate (i.e., covers all of the exposed surface of the package substrate that is not covered by the die and/or other components). Although only one die is shown, a plurality of dies may be attached to the package substrate. FIG. 2C shows die 202, underfill 210 extending beyond die 202, and ground planes 206b, 206c, which are not continuous and cover only a portion of the exposed surface of the package substrate (i.e., covers some of the exposed surface of the package substrate that is not covered by the die and/or other components). In some embodiments, as shown in FIGS. 2B and 2C, the external ground plane may be a single ground plane or may be a plurality of ground planes, and may have any shape and size that is suitable. For example, the external ground plane may be rectangular, square, L-shaped, or any other shape. The external ground plane may be made from any suitable conductive material, including, for example, copper, stainless steel, beryllium (Be), molybdenum (Mo), tungsten (W), silicon carbide (SiC), tungsten carbide (WC), or any other suitable material. In some embodiments, the external ground plane may also function as a stiffener and may be made of copper, stainless steel, beryllium (Be), molybdenum (Mo), tungsten (W), silicon carbide (SiC), tungsten carbide (WC), and any other metal with a high Young's modulus (i.e., Young's modulus value of about 90 GPa or greater). External ground plane may be attached to the package substrate using any suitable means, such as, for example, adhesive, conductive adhesive, solder paste materials, or solder balls. External ground plane may have more than one means of attachment to the package substrate, for example, non-conductive adhesive, such as epoxy or silicon, may connect the external ground plane to the package substrate and solder balls may electrically connect the external ground plane to the internal ground plane. In another example, an anisotropic conductive adhesive may be dispensed or printed on surface contact pads and then non-conductive adhesive may be dispensed in the non-pad areas. The adhesives may be cured, for example, under high pressure. In one embodiment, an anisotropic conductive adhesive may include fillers. A representative example of a filler is a conductive material-coated (e.g., metal-coated) elastomeric ball (e.g., gold or silver or silver/gold coated balls) or similar shaped materials that are compressible under bonding pressure. Fillers, such as elastomeric balls, may provide improved tolerance to process variations and improved contact in electrical performance in addition to providing a conductive pad between the stiffener and the package substrate. In another embodiment, the filler is a gold, silver, or silver/gold coated copper ball. In some embodiments, external ground plane is a metal stiffener that protects against warpage and provides structure to the package substrate, which is especially useful in coreless and ultra-thin core (UTC) integrated circuit products.

In some embodiments, contact pads may be formed between external ground plane and package substrate. In some embodiments, a solder resist may be disposed on the package substrate and openings may be formed through the solder resist and dielectric layers and filled with conductive material to electrically connect the external ground plane to the internal ground plane. In some embodiments, a conductive adhesive may be disposed or formed between the external ground plane and the conductive contacts on the package substrate. FIG. 3F shows an anisotropic conductive adhesive disposed between the external ground plane and the surface contact pads on the package substrate to attached the external ground plane to the package substrate and electrically connect the external ground plane to the internal ground plane. An anisotropic conductive adhesive may be dispensed or printed on to conductive pads and then a non-conductive adhesive, such as a silicon adhesive, may be dispensed in the other non-conductive areas. The adhesives may be cured, for example, under high pressure. In one embodiment, an anisotropic conductive adhesive may include fillers. A representative example of a filler is a conductive material-coated (e.g., metal-coated) elastomeric ball (e.g., gold or silver or silver/gold coated balls) or similar shaped materials that are compressible under stiffener bonding pressure. Fillers such as elastomeric balls can provide improved process tolerance to variations and potentially better contact in electrical performance in addition to providing a conductive pad between the stiffener and the package substrate. In another embodiment, the filler is a gold, silver, or silver/gold coated copper ball.

Various operations will be described as multiple discrete operations, in turn, in a manner that is most helpful in understanding the present disclosure. However, the order of description should not be construed to imply that these operations are necessarily order dependent or performed only once each. In particular, these operations need not be performed in the order of presentation, and may be repeated or performed in a different order (e.g., parallel). Operations described may be performed in a different order from the described embodiment(s). Various additional operations may be performed, and/or described operations may be omitted in additional embodiments.

Figure 3A:
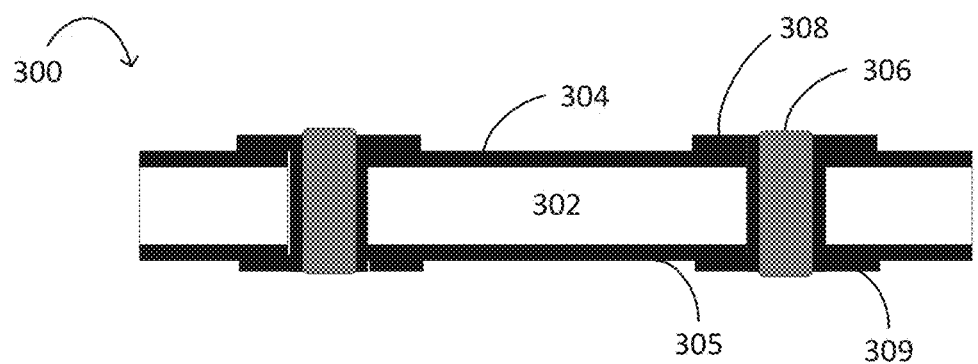
FIGS. 3A-3F are schematic illustrations of fabricating an example integrated circuit package having microstrip routing and a ground plane external to the package substrate, according to some embodiments of the present disclosure.
Figure 3B:
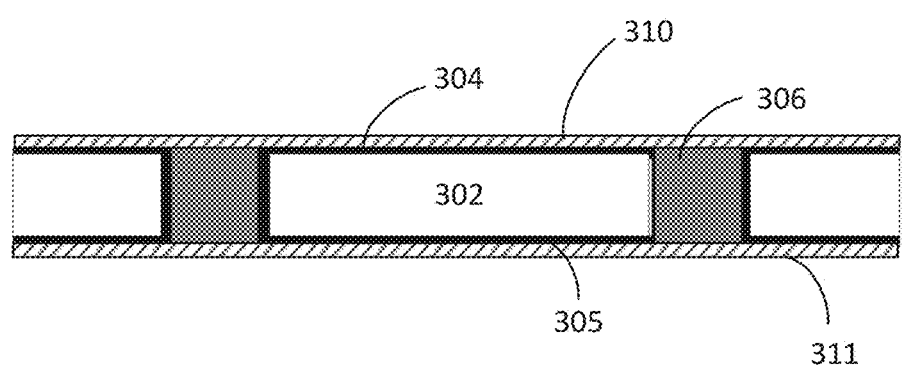
Figure 3C:
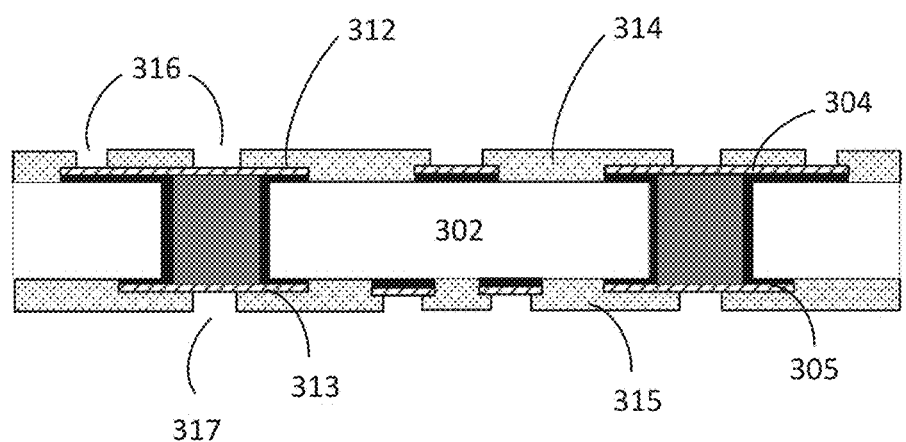
Figure 3D:
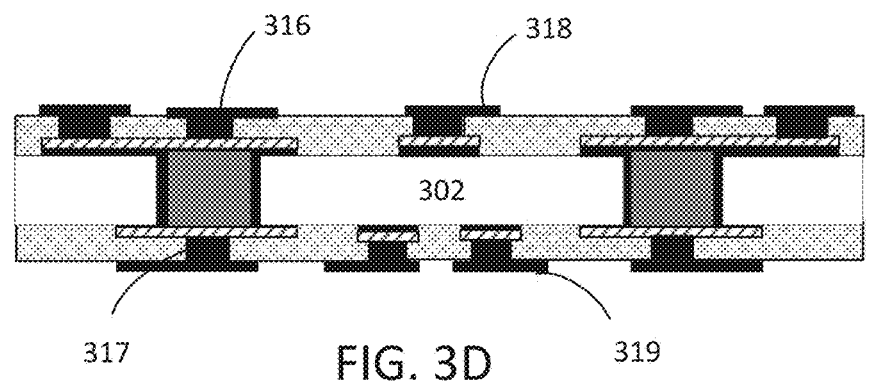
Figure 3E:
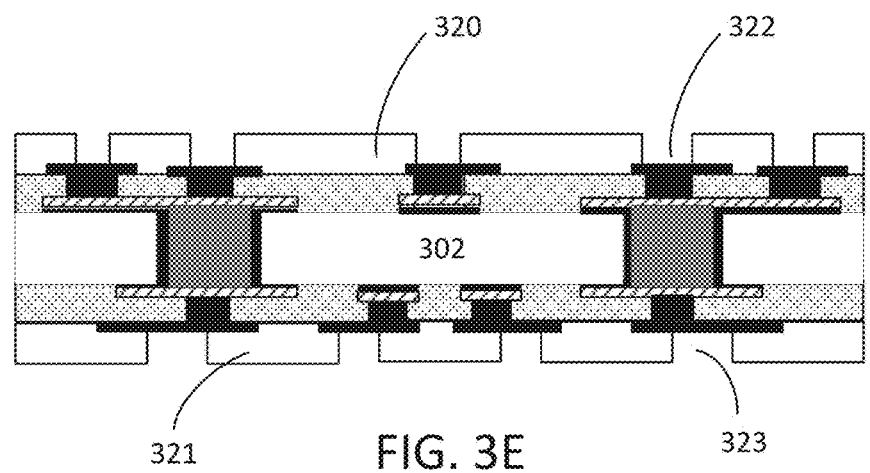
Figure 3F:
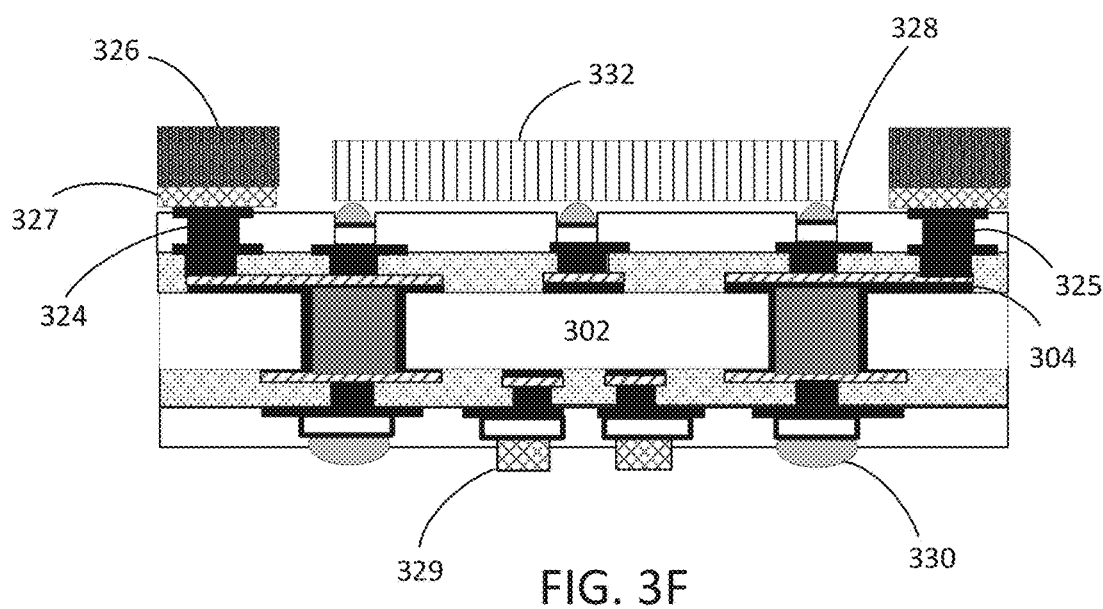

The method 300 is depicted in FIGS. 3A-3F, and, as shown in FIG. 3A, begins with providing a layer of ground plane material 304, 305 on both sides of substrate 302. Plated through holes 306 may be formed by mechanically drilling through substrate 302 and ground layers 304, 305 to form through holes. The through holes may be plated with metal 308, 309, such as copper, and filled (or plugged) with conducive material, such as copper, to form plated through holes 306.

The substrate 302, as described above, may be made of any material suitable for building a package substrate. In some embodiments, the thickness of substrate or core 302 may range from approximately 100 um to 1500 um. In some embodiments, the thickness is approximately 100 um to 400 um.

The internal ground layer material 304, 305 may comprise any conducting or superconducting material suitable for serving as an interconnect in an integrated circuit, such as e.g. copper (Cu), nickel (Ni), aluminum (Al), niobium (Nb), niobium nitride (NbN), niobium titanium nitride (NbTiN), titanium nitride (TiN), molybdenum rhenium (MoRe), etc., or any alloy of two or more superconducting/conducting materials. In some embodiments, the internal ground plane material is copper. The ground plane material 304, 305 may be deposited over the substrate 302 using any known techniques for depositing conducting/superconducting materials, such as e.g. atomic layer deposition (ALD), physical vapor deposition (PVD) (e.g. evaporative deposition, magnetron sputtering, or e-beam deposition), chemical vapor deposition (CVD), or electroplating. In various embodiments, the thickness of the layer of the ground plane material 304, 305 may be between 10 and 200 microns (um) including all values and ranges therein. For example, in some embodiments, the thickness is between 20 and 40 um, and, in some embodiments, the thickness is approximately 25 um.

The thickness of the metal plating may range from 3 um to 40 um. In some embodiments, the thickness is approximately 20 um. The diameter of the plated through holes may range from 200 um to 500 um. In some embodiments, the diameter is approximately 350 um.

As used herein, the term "thickness" refers to a dimension of a certain element or layer as measured along the z-axis, the term "width" refers to a dimension of a certain element or layer as measured along the y-axis, while the term "length" refers to a dimension of a certain element or layer as measured along the x-axis.

As shown in FIG. 3B, the plated through hole plug 306 and metal plating 308, 309 may be planarized by grinding, or any other suitable process. Optionally, a layer of copper or other metal 310, 311 may be formed on the ground layers 304, 305 to cap the plated through holes 306.

As shown in FIG. 3C, method 300 may proceed with patterning 312, 313 the layer of the ground plane material 304, 305 and, if used, cap material 310, 311 to form a structure that will serve as a ground plane layer of a transmission line layer, then, depositing and patterning a dielectric layer 314, 315. The ground plane structure 304, 305, and, optionally, 310, 311, may have any shapes/geometries suitable for serving as a ground plane conductor of a microstrip line. In some embodiments, the ground plane 304, 305 is continuous and covers the entire surface of substrate 302. In some embodiments, the ground plane 312, 313 is patterned and covers a portion of the surface of substrate 302. In general, the width of the ground plane structure is limited by practical application, as the ground planes would be ideally infinite planes.

In some embodiments, after patterning and etching the ground plane layer, the substrate may be cleaned to remove surface-bound organic and metallic contaminants, as well as subsurface contamination. In some embodiments, cleaning may be carried out using e.g. a chemical solution (such as peroxide), and/or with UV radiation combined with ozone, and/or oxidizing the surface (e.g., using thermal oxidation) then removing the oxide (e.g. using hydrofluoric acid).

In various embodiments, any suitable patterning techniques may be used to form the ground plane at the desired locations on the substrate, such as, e.g. patterning techniques employing photoresist or other masks defining the dimensions and location of the future ground plane conductor. An exemplary photoresist patterning technique could include depositing a photoresist over the substrate. The photoresist may be a positive or negative resist and may include for example, poly(methyl methacrylate), poly(methyl glutarimide), DNQ/novolac, or SU-8 (an epoxy based negative resist). The photoresist may be chemically amplified containing a photoacid generator and may be based on polymers or co-polymers which contain aromatic rings or alicyclic norbornene derivatives (e.g. for etch resistance), and have protecting groups such as t-butyl. The polymers may include polystyrene or acrylate polymers. The photoresist may be deposited by a casting process such as, for example, spin-coating. The photoresist may then be patterned by optically projecting an image of a desired pattern onto the photoresist using photolithography, such as optical photolithography, immersion photolithography, deep UV lithography, extreme UV lithography, or other techniques. A developer, such as tetramethylammonium hydroxide TMAH (with or without surfactant) at a concentration of in the range of 0.1 N to 0.3 N, may be applied to the photoresist, such as by spin-coating, and portions of the photoresist are removed to expose regions of the underlying layer correlating to the desired pattern. In some embodiments, baking of the substrate may occur before or after any of the above actions. For example, the substrate may be prebaked to remove surface water. After application of the photoresist, a post application bake may occur, wherein at least a portion of the solvents in the photoresist are driven off. After exposure to light, a post-exposure bake may occur to induce chemical reactions, such as de-protecting the photoresist. After patterning, the resist may be hard baked.

Next, a layer of dielectric material 314, 315 is provided over the substrate 302 with the ground plane 312, 313 formed thereon. The dielectric material 314, 315 may be selected as any dielectric material suitable for undergoing further fabrication processing described herein. For example, since the dielectric layer 314, 315 will need to be etched to form vias 316, etching properties of potential candidate materials are to be considered when selecting a suitable material to be used for the layer. Besides appropriate etching characteristics, some other considerations in selecting a suitable material may include e.g. possibilities of smooth film formation, low shrinkage and outgassing, and good dielectric properties (such as e.g. low electrical leakage, suitable value of a dielectric constant, and thermal stability). Examples of dielectric materials that may be used as the material of the dielectric layer 446 include, but are not limited to, silicon dioxide (SiO2), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass.

In some embodiments, the dielectric material 314, 315 may include an oxide deposited over the ground plane conductor 312, 313 using e.g. chemical vapor deposition or/and plasma-enhanced chemical vapor deposition, as typically done in conventional processing. In some embodiments, the dielectric material 314, 315 may include a dielectric material formed over the ground plane conductor 312, 313 using coating techniques involving cross-linking of liquid precursors into solid dielectric materials. In some embodiments, the surface of the ground plane conductor 312, 313 may be cleaned or treated prior to applying the dielectric to reduce surface contamination and minimize interface traps and/or promote adhesion, for example using chemical or plasma clean, or applying heat in a controlled environment. In some embodiments, an "interface layer" may be applied between the ground plane conductor 312, 313 and the dielectric material 314, 315 to prevent, decrease, or minimize spontaneous and uncontrolled formation of other interfacial layers. In some embodiments, an adhesion promoter or adhesion layer may be applied prior to application of the dielectric.

Planarization may also be performed in order to achieve a relatively smooth, plane surface of the dielectric layer 314, 315. In various embodiments, planarization may be performed using either wet or dry planarization processes. In one embodiment, planarization may be performed using chemical mechanical planarization (CMP), which may be understood as a process that utilizes a polishing surface, an abrasive and a slurry to remove the overburden and planarize the surface.

A thickness of the dielectric layer 314, 315, may vary and may depend on the desired distance between the microstrip signal layer and the ground plane. For example, the dielectric layer 314, 315 may have a thickness between 10 um to 40 um, including all values and ranges therein, typically between 15 um to 25 um.

The method 300 may then proceed with forming one or more vias 316 in the dielectric layer 314, 315 to connect to the ground plane 312, 313. Number, dimensions and a shape of the vias 316 may vary and may depend on, for example, the conductive or superconductive material used to fill the vias, dimensions and shape of the ground plane 312, 313, and the etching process used to form the vias 316. For example, in some embodiments, a plurality of vias arranged along two lines at the edges of the ground plane 312, 313 may be used. However, in other embodiments, any other number of vias 316, arranged in any location and in any shape/geometry as suitable for providing electrical interconnection to the ground plane conductor 312, 313 of a microstrip line may be used.

The via openings extend from the surface of the dielectric layer 314, 315 to the ground plane structure 312, 313. The dielectric layer 314, 315 at least partially surrounds the via openings 316, 317 isolating them from one another and from other openings that may be formed (not shown) both physically and electrically.

In various embodiments, dimensions of the vias 316, 317 may be between 50 um and 150 um for both the x-axis and y-axis, including all values and ranges therein. Top and bottom contact pads 316, 317 may range in diameter from 100 um to 200 um, or may be any other suitable size according to manufacturing tolerances and reliable contact performance.

In various embodiments, any kind of etching techniques, possibly techniques that involve etching in combination with patterning, e.g. patterning as described above, may be used to form the vias 316, 317. For example, once patterning has been done to expose portions of the underlying layer 314, 315 in a patterned mask that defines location and arrangement of future vias 316, 317, exposed portions of the underlying layer 314, 315 are then chemically etched. During the etch, the exposed portions of the surface of the dielectric layer 314, 315 are removed until a desired depth is achieved, forming via openings 316, 317 in the dielectric layer 314, 315. If photoresist patterning is used for creating a mask for forming vias, the remaining photoresist may then optionally be removed, e.g. by a process such as ashing, where the photoresist is exposed to oxygen or fluorine, which combines with the photoresist to form ash.

As shown in FIG. 3D, the method 300 may then proceed with filling the one or more vias 316, 317 in the dielectric layer 314, 315 with a conducting or superconducting material suitable to provide electrical connectivity to the ground plane 312, 313. In various embodiments, the via material may comprise any conducting or superconducting material suitable for serving as an interconnect in an integrated circuit, such as e.g. materials described above with reference to the material of the ground plane layer 304, 305. In some embodiments, the via material may be the same as the material of the ground plane layer 304, 305. In other embodiments, at least some of the conductive or superconductive materials used in different elements described herein could be different.

The vias 316, 317 may be filled using any suitable techniques for filling via openings, such as, e.g. CVD or PVD. Planarization, using e.g. any planarization processes described above, may also be performed in order to expose the surfaces of the dielectric layer which may be covered with the via material as a result of depositing that material into the via openings.

In some embodiments, one or more of diffusion and adhesion barrier layers as known in the art may be deposited into the via openings prior to filling the openings with the via material. As is known, diffusion barriers may serve to reduce diffusion of the conductive/superconductive via material out of the via and adhesion barriers may serve to promote adhesion between the conductive/superconductive via material and the walls of the via openings.

Next, a layer of conductor strip material may be provided on the surface of the dielectric material 314, 315 with the vias 316, 317, and then patterned 318, 319. Considerations described above with reference to the ground plane material 304, 305 are applicable to the conductor strip material 318, 319 and deposition thereof and, therefore, in the interest of brevity, are not repeated here. In some embodiments, the conductor strip material 318, 319 may be the same as the material of the ground plane layer 304, 305 or/and as the material of the vias 316, 317 in the dielectric layer 314, 315.

In some embodiments, the surface of the dielectric material 314, 315 or, if used, the etch stop layer (not shown) may be cleaned or treated prior to applying the conductor strip material 318, 319 to reduce surface contamination and minimize interface traps and/or promote adhesion, for example using a chemical or plasma clean, or applying heat in a controlled environment. In some embodiments, an adhesion promoter or adhesion layer may be applied prior to application of the conductor strip material 318, 319.

In various embodiments, the thickness of the layer of the conductor strip material 318, 319 may be between 10 um to 40 um including all values and ranges therein, e.g. between 20 um to 30 um. The method 300 may then proceed with patterning the layer of the conductor strip material 318, 319 to form a structure that will serve as a conductor strip of a transmission line. In general, the width of the conductor strip varies depending on the design, and may vary from a few microns to hundreds or thousands of microns. In various embodiments, the width of the conductor strip 318, 319 may be between 0.05 and 20 microns including all values and ranges therein, e.g. between 1 and 11 microns, or between 3 and 5 microns. In various embodiments, the width of the conductor strip 318, 319 may be between 20 microns to 40 microns including all values and ranges therein. In various embodiments, any kind of conventional patterning techniques may be used to form the conductor strip 318, 319. Descriptions provided above with reference to patterning the ground plane 304, 304 are applicable to patterning the conductor strip 318, 319 and, therefore, in the interests of brevity, are not repeated here.

As shown in FIG. 3E, the method 300 may proceed to deposit a solder resist layer 320, 321 on the surface of the dielectric material 314, 315 with the conductor strip material 318, 319, and then patterned 322, 323. The solder resist material may be, for example, a polyimide or similar material.

As shown in FIG. 3F, package substrate may be finished on the upper and lower contacts, including filling vias 324, 325 with conductive material and attaching an external ground plane 326 to vias 324, 325 using conductive adhesive 327 to electrically connect the external ground plane 326 to the internal ground plane 304. As described above, external ground plane 326 may be made of any suitable material, such as copper or stainless steel, among others. In some embodiments, the external ground plane may also function as a stiffener and may be made of any suitable metal having a high Young's modulus, such as copper, stainless steel, beryllium (Be), molybdenum (Mo), tungsten (W), silicon carbide (SiC), and tungsten carbide (WC). Conductive adhesive 327 may be made of any suitable material as known in the art, such as an adhesive base with a conductive filler (e.g., an epoxy base with a silver filler). In some embodiments, external ground plane 326 may be electrically connected to vias 324, 325 by solder balls, or other suitable means.

In some embodiments, a surface finish may be applied, such as an electroless metal or patterned copper to enlarge the available metal area for die attachment. In some embodiments, assembly may be performed on the exposed copper with the surface protected by a thin surface finish, such as Organic Solderability Preservative (OSP) or immersion gold (Au). In some embodiments, as shown, a package substrate may be finished by applying controlled collapse chip connection (C4) bump formation to the top die contact areas 328 for die 332 attachment, and applying chip capacitor (C/C) assembly to the bottom contact areas 329, 330 for attachment of the package substrate to, for example, a motherboard (not shown).

The finished substrate may be a single package substrate or may be a repeating unit that may undergo a singulation process in which each unit is separated for one another to create a single package substrate. The singulation process may occur after C4 bump formation process or at any other suitable point in the process, including after the external ground plane has been attached to the surface of the package substrate. Singulated substrates may be any suitable size and any suitable thickness; typically, substrates may be 50 mm by 50 mm in size, and between 100 um and 2000 um in thickness. Although FIGS. 3A-3F show only two conductive layers and one dielectric layer, it is readily understood that the package substrate may have multiple layers of alternating conductive material and dielectric material, and may have different signal architecture in the conductive layers with the microstrip routing layer is the uppermost metallization layer.

Figure 4:
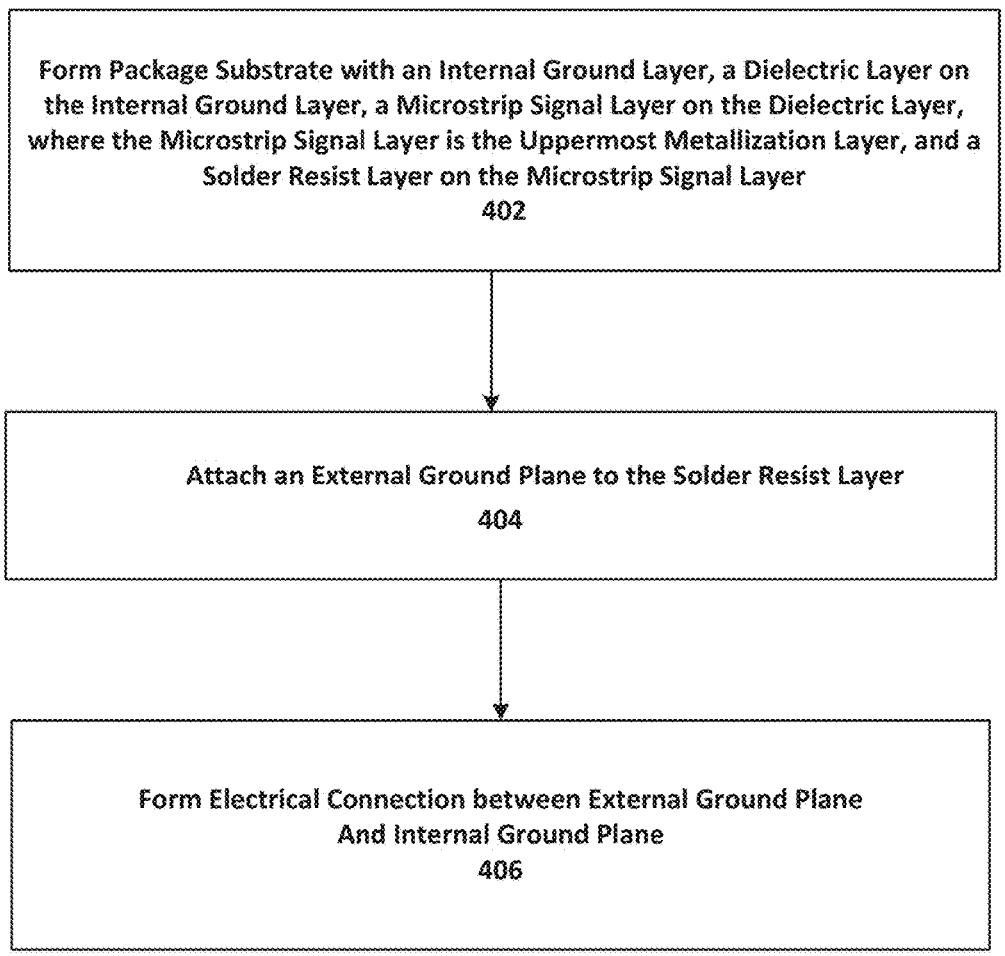
FIG. 4 is a flow chart of a method for fabricating an example integrated circuit package having microstrip routing and a ground plane external to the package substrate, according to some embodiments of the present disclosure.

FIG. 4 is a flow diagram of an example method of manufacturing an integrated circuit package having a package substrate that includes microstrip signal lines as the uppermost metallization layer, and an external ground plane electrically connected to the internal ground plane of the microstrip structure in the package substrate, in accordance with various embodiments. Although the various operations discussed with reference to the method are shown in a particular order, the operations may be performed in any suitable order (e.g., in any combination of parallel or series performance), and may be repeated or omitted as suitable.

At 402, a package substrate may be formed having an internal ground layer, a dielectric layer on the internal ground layer, a microstrip signal layer on the dielectric layer, where the microstrip signal layer is the uppermost metallization layer; and a solder resist layer on the microstrip signal layer. For example, the package substrate may be formed as described with respect to FIGS. 3A-3F.

At 404, an external ground plane may be attached to the solder resist layer of the package substrate.

At 406, an electrical connection between the external ground plane and the internal ground plane of the microstrip architecture may be formed. The electrical connection may be formed from one or more vias. The attachment of the external ground plane may be at the same connection as the surface connection that electrically connects the external ground plane to the internal ground plane. For example, the external ground plane may be attached to the package substrate using solder balls on the via surface, which also electrically connects the external ground plane to the internal ground plane. External ground plane may be attached before or after the die is attached.

Figure 5A:
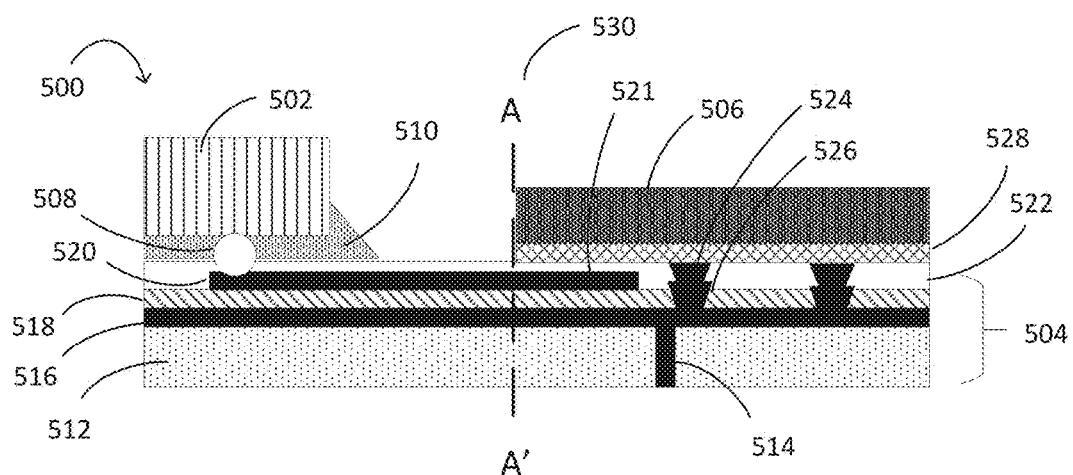
FIG. 5A is a schematic illustration of a cross-section view of an example integrated circuit package having microstrip routing and a ground plane external to the package substrate showing an impedance differential, according to some embodiments of the present disclosure.

FIG. 5A is a schematic illustration of a cross-section view of a top portion of an example integrated circuit package having an impedance differential between areas where microstrip transmission lines are covered by an external ground plane and areas where microstrip transmission lines are not covered by the external ground plane, in accordance with various embodiments. As shown in FIG. 5A, integrated circuit package 500 may include die 502, package substrate 504, and external ground plane 506. Only the top side (also referred to herein as the back side) of the package substrate is shown in FIG. 5A for clarity; however, conductive and dielectric layers may be formed on both sides of substrate 512. Die 502 may be connected to package substrate 504 by FLI 508 and, optionally, have underfill 510. Package substrate 504 may include substrate 512, plated through hole 514, internal ground plane 516, dielectric layer 518, and microstrip signal layer 520. Package substrate 504 may include solder resist layer 522. External ground plane 506 may be attached to the package substrate using conductive adhesive 528 and electrically connected to the internal ground plane 516 by one or more vias 524, 526. In some embodiments, external ground plane may cover only a portion of the surface of the package substrate, which may cause a variance in impedance value between areas covered by the external ground plane and areas uncovered by the external ground plane. Dashed line A-A' 530 indicates the separation between areas that are not covered versus areas that are covered.

Figure 5B:
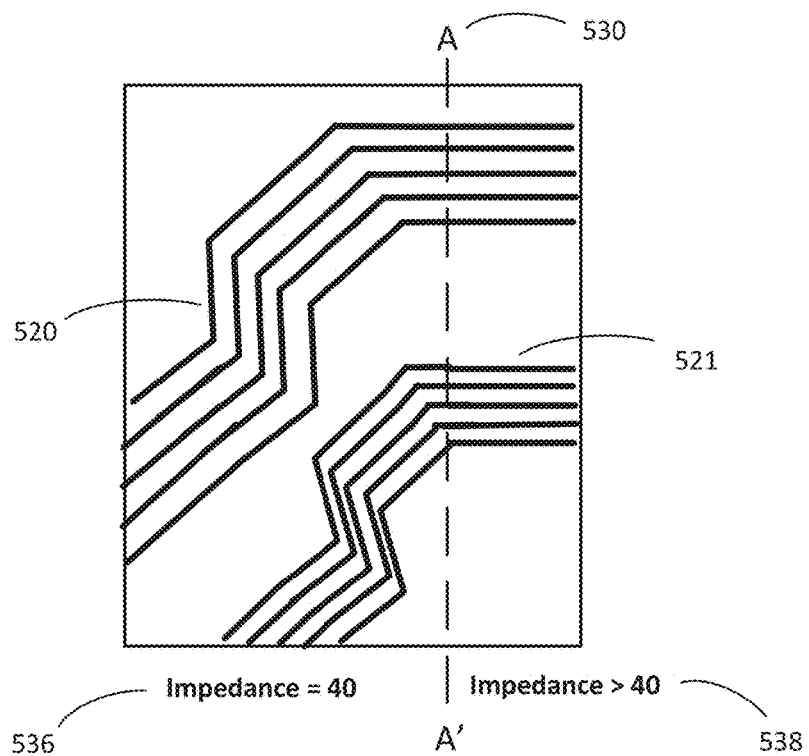
FIG. 5B is a schematic illustration of a top plane view of signal lines in FIG. 5A showing an impedance differential, according to some embodiments of the present disclosure.

FIG. 5B is a schematic illustration of a top plane view of microstrip transmission lines in FIG. 5A having an impedance differential, in accordance with various embodiments. As shown in FIG. 5B, microstrip transmission lines on the right side of the A-A' line 530 are not covered by external ground plane 506 and, for example, have an impedance value of 40 ohm 536. Microstrip transmission lines on the left side of the A-A' line 521 are covered by external ground plane and, for example, have an impedance of greater than 40 ohm 538. As described above regarding FIG. 5A, dashed line A-A' indicates the separation between areas that are not covered by external ground plane 506 versus areas that are covered. An impedance differential across the length of transmission lines may reduce electrical performance and increase crosstalk. Correcting an impedance differential to reduce impedance mismatch is preferred. Changing the transmission geometry may alter the impedance value such that the impedance values may be approximately equal.

Figure 6A:
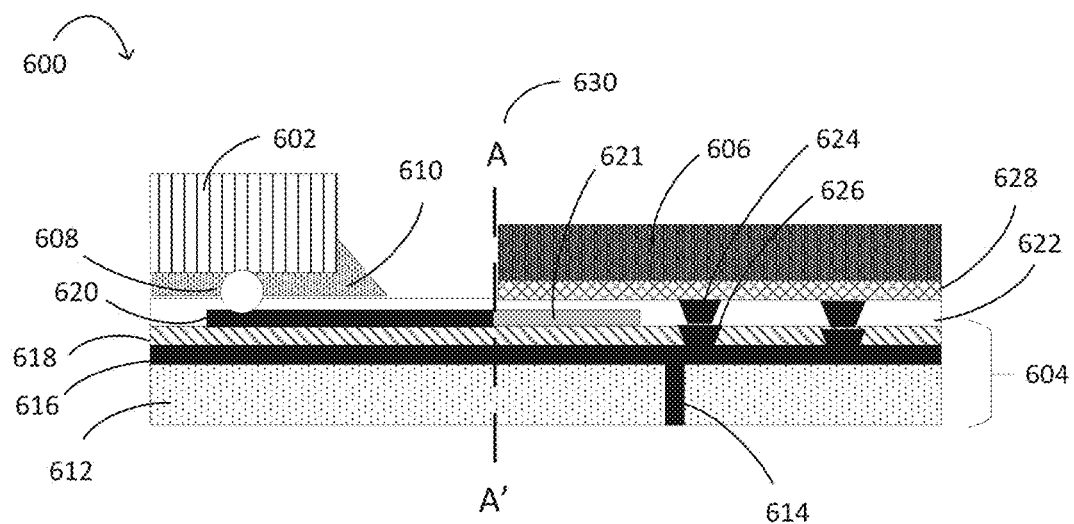
FIG. 6A is a schematic illustration of a cross-section view of an example integrated circuit package having microstrip routing and a ground plane external to the package substrate showing a corrected impedance differential, according to some embodiments of the present disclosure.

FIG. 6A is a schematic illustration of a cross-section view of a top portion of an example integrated circuit package where the impedance differential is corrected by changing the geometry of the microstrip transmission lines, in accordance with various embodiments. As shown in FIG. 6A, integrated circuit package 600 may include die 602, package substrate 604, and external ground plane 606. Similarly, as in FIG. 5A, only the top side of the package substrate is shown in FIG. 6A for clarity; however, conductive and dielectric layers may be formed on both sides of substrate 612. Die 602 may be connected to package substrate 604 by FLI 608 and, optionally, have underfill 610. Package substrate 604 may include substrate 612, plated through hole 614, internal ground plane 616, dielectric layer 618, and microstrip signal layer 620, 621. Microstrip signal layer may include transmission lines having different geometries where one portion of the line is wider 620 than another portion 621. Package substrate 604 may include solder resist layer 622. External ground plane 606 may be attached to the package substrate using conductive adhesive 628 and electrically connected to the internal ground plane 616 by one or more vias 624, 626. In some embodiments, as shown, external ground plane 606 may cover only a portion of the surface of the package substrate, which may cause a variance in impedance value between areas covered by the external ground plane and areas uncovered by the external ground plane. Dashed line A-A' 630 indicates the separation between areas that are not covered versus areas that are covered.

Figure 6B:
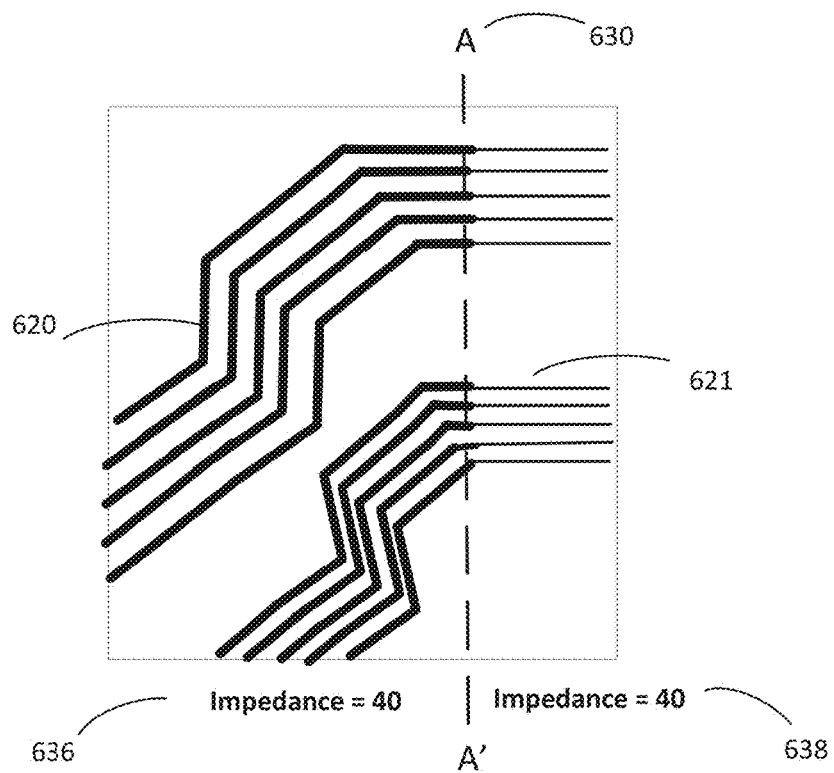
FIG. 6B is a schematic illustration of a top plane view of signal lines in FIG. 6A showing a corrected impedance differential, according to some embodiments of the present disclosure.

FIG. 6B is a schematic illustration of a top plane view of microstrip transmission lines in FIG. 6A showing the change in microstrip transmission line geometry to correct the impedance differential that may result from the external ground plane covering only a portion of the surface of the package substrate, in accordance with various embodiments. As shown in FIG. 6B, microstrip transmission lines on the right side 620 of the A-A' line are not covered by external ground plane 606 and, for example, have an impedance value of 40 ohm 636. Microstrip transmission lines on the left side 621 of the A-A' line are covered by external ground plane and, have a different geometry where the transmission lines are thinner to reduce the impedance to approximately the same value of 40 ohm 638. Transmission lines may be patterned with narrow segments and wide segments such that impedance values may be approximately the same and within the ranges required by the integrated circuit package. Impedance values may be calculated using methods known in the art and transmission line geometry may be change accordingly to match impedance values across the length of the line. By maintaining the impedance value across the length of transmission lines, electrical performance may be sustained and crosstalk may be reduced.

Although the conductor strip is shown as a substantially straight line in FIGS. 5B and 6B, the conductor strip structure may have any other shapes/geometries suitable for serving as a signal line conductor of a microstrip line. For example, the conductor strip may have various shapes such as e.g. substantially straight line, a line with bends (e.g. a wiggly line or a line comprising one or more loop portions), or any other configuration suitable for a particular integrated circuit design.

Figure 8:
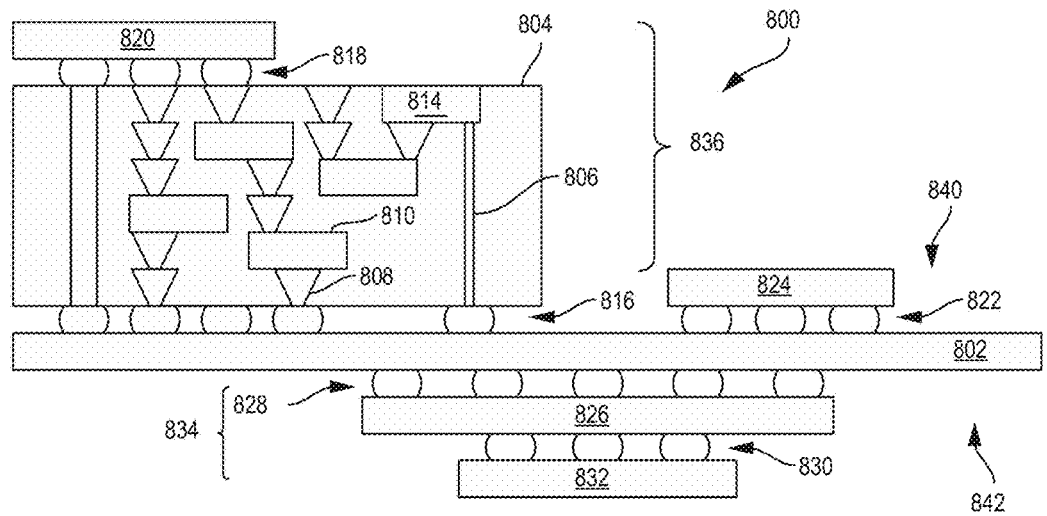
FIG. 8 is a cross-sectional side view of an integrated circuit device assembly that may include any of the embodiments of the integrated circuit structures disclosed herein.
Figure 9:
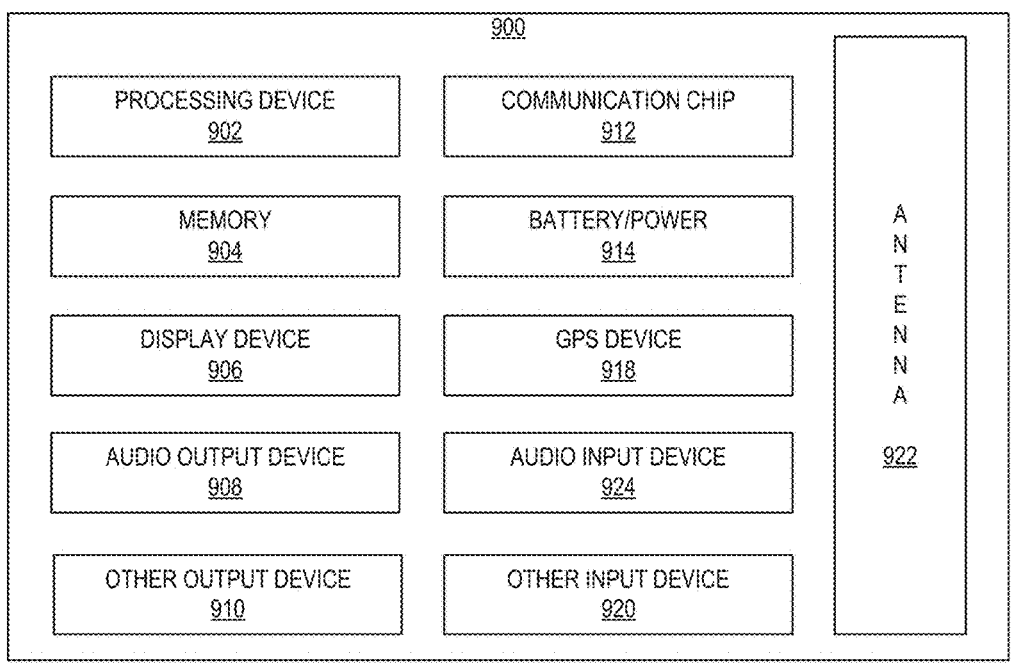
FIG. 9 is a block diagram of an example computing device that may include any of the embodiments of the IC structures disclosed herein.

The package substrates disclosed herein may be included in any suitable electronic device. FIGS. 7-9 illustrate various examples of apparatuses that may be included in, or that may include, one or more of any of the package substrates disclosed herein.

FIGS. 7A-B are top views of a wafer 701 and dies 705 that may be included in an IC package along with any of the package substrates disclosed herein. The wafer 701 may be composed of semiconductor material and may include one or more dies 705 having IC elements formed on a surface of the wafer 701. Each of the dies 705 may be a repeating unit of a semiconductor product that includes any suitable IC. After the fabrication of the semiconductor product is complete, the wafer 701 may undergo a singulation process in which each of the dies 705 is separated from one another to provide discrete "chips" of the semiconductor product. The die 705 may include one or more transistors (e.g., some of the transistors 740 of FIG. 7C, discussed below) and/or supporting circuitry to route electrical signals to the transistors, as well as any other IC components. In some embodiments, the wafer 701 or the die 705 may include a memory device (e.g., a static random access memory (SRAM) device), a logic device (e.g., AND, OR, NAND, or NOR gate), or any other suitable circuit element. Multiple ones of these devices may be combined on a single die 705. For example, a memory array formed by multiple memory devices may be formed on a same die 705 as a processing device (e.g., the processing device 902 of FIG. 9) or other logic that is configured to store information in the memory devices or execute instructions stored in the memory array. In some embodiments, the die 705 may include circuitry that is to couple to and interact with circuitry provided by integral devices in the package substrate, after the die 705 is coupled to the package substrate, as discussed above.

FIG. 7C is a cross-sectional side view of an IC device 700 that may be included in a die that may be coupled to any of the package substrates disclosed herein. In particular, one or more of the IC devices 700 may be included in one or more dies. The IC device 700 may be formed on a substrate 702 (e.g., the wafer 701 of FIG. 7A) and may be included in a die (e.g., the die 705 of FIG. 7B). The substrate 702 may be a semiconductor substrate composed of semiconductor material systems including, for example, N-type or P-type materials systems. The substrate 702 may include, for example, a crystalline substrate formed using a bulk silicon or a silicon-on-insulator substructure. In some embodiments, the substrate 702 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 702. Although a few examples of materials from which the substrate 702 may be formed are described here, any material that may serve as a foundation for an IC device 700 may be used. The substrate 702 may be part of a singulated die (e.g., the dies 705 of FIG. 7B) or a wafer (e.g., the wafer 701 of FIG. 7A).

The IC device 700 may include one or more device layers 704 disposed on the substrate 702. The device layer 704 may include features of one or more transistors 740 (e.g., metal oxide semiconductor field-effect transistors (MOSFETs)) formed on the substrate 702. The device layer 704 may include, for example, one or more source and/or drain (S/D) regions 720, a gate 722 to control current flow in the transistors 740 between the S/D regions 720, and one or more S/D contacts 724 to route electrical signals to/from the S/D regions 720. The transistors 740 may include additional features not depicted for the sake of clarity, such as device isolation regions, gate contacts, and the like. The transistors 740 are not limited to the type and configuration depicted in FIG. 7C and may include a wide variety of other types and configurations such as, for example, planar transistors, non-planar transistors, or a combination of both. Nonplanar transistors may include FinFET transistors, such as double-gate transistors or tri-gate transistors, and wraparound or all-around gate transistors, such as nanoribbon and nanowire transistors.

Each transistor 740 may include a gate 722 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 740 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 740 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 720 may be formed within the substrate 702 adjacent to the gate 722 of each transistor 740. The S/D regions 720 may be formed using either an implantation/diffusion process or an etching/deposition process, for example. In the former process, dopants such as boron, aluminum, antimony, phosphorous, or arsenic may be ion-implanted into the substrate 702 to form the S/D regions 720. An annealing process that activates the dopants and causes them to diffuse farther into the substrate 702 may follow the ion-implantation process. In the latter process, the substrate 702 may first be etched to form recesses at the locations of the S/D regions 720. An epitaxial deposition process may then be carried out to fill the recesses with material that is used to fabricate the S/D regions 720. In some implementations, the S/D regions 720 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 720 may be formed using one or more alternate semiconductor materials such as germanium or a group III-V material or alloy. In further embodiments, one or more layers of metal and/or metal alloys may be used to form the S/D regions 720.

Electrical signals, such as power and/or input/output (I/O) signals, may be routed to and/or from the transistors 740 of the device layer 704 through one or more interconnect layers disposed on the device layer 704 (illustrated in FIG. 7C as interconnect layers 706-710). For example, electrically conductive features of the device layer 704 (e.g., the gate 722 and the S/D contacts 724) may be electrically coupled with the interconnect structures 728 of the interconnect layers 706-710. The one or more interconnect layers 706-710 may form an interlayer dielectric (ILD) stack 719 of the IC device 700.

The interconnect structures 728 may be arranged within the interconnect layers 706-710 to route electrical signals according to a wide variety of designs (in particular, the arrangement is not limited to the particular configuration of interconnect structures 728 depicted in FIG. 7C). Although a particular number of interconnect layers 706-710 is depicted in FIG. 7C, embodiments of the present disclosure include IC devices having more or fewer interconnect layers than depicted.

In some embodiments, the interconnect structures 728 may include trench structures 728a (sometimes referred to as "lines") and/or via structures 728b (sometimes referred to as "holes") filled with an electrically conductive material such as a metal. The trench structures 728a may be arranged to route electrical signals in a direction of a plane that is substantially parallel with a surface of the substrate 702 upon which the device layer 704 is formed. For example, the trench structures 728a may route electrical signals in a direction in and out of the page from the perspective of FIG. 7C. The via structures 728b may be arranged to route electrical signals in a direction of a plane that is substantially perpendicular to the surface of the substrate 702 upon which the device layer 704 is formed. In some embodiments, the via structures 728b may electrically couple trench structures 728a of different interconnect layers 706-710 together.

The interconnect layers 706-710 may include a dielectric material 726 disposed between the interconnect structures 728, as shown in FIG. 7C. In some embodiments, the dielectric material 726 disposed between the interconnect structures 728 in different ones of the interconnect layers 706-710 may have different compositions; in other embodiments, the composition of the dielectric material 726 between different interconnect layers 706-710 may be the same.

A first interconnect layer 706 (referred to as Metal 1 or "M1") may be formed directly on the device layer 704. In some embodiments, the first interconnect layer 706 may include trench structures 728a and/or via structures 728b, as shown. The trench structures 728a of the first interconnect layer 706 may be coupled with contacts (e.g., the S/D contacts 724) of the device layer 704.

A second interconnect layer 708 (referred to as Metal 2 or "M2") may be formed directly on the first interconnect layer 706. In some embodiments, the second interconnect layer 708 may include via structures 728b to couple the trench structures 728a of the second interconnect layer 708 with the trench structures 728a of the first interconnect layer 706. Although the trench structures 728a and the via structures 728b are structurally delineated with a line within each interconnect layer (e.g., within the second interconnect layer 708) for the sake of clarity, the trench structures 728a and the via structures 728b may be structurally and/or materially contiguous (e.g., simultaneously filled during a dual-damascene process) in some embodiments.

A third interconnect layer 710 (referred to as Metal 3 or "M3") (and additional interconnect layers, as desired) may be formed in succession on the second interconnect layer 708 according to similar techniques and configurations described in connection with the second interconnect layer 708 or the first interconnect layer 706.

The IC device 700 may include a solder resist material 734 (e.g., polyimide or similar material) and one or more bond pads 736 formed on the interconnect layers 706-710. The bond pads 736 may provide the contacts to couple to first level interconnects, for example. The bond pads 736 may be electrically coupled with the interconnect structures 728 and configured to route the electrical signals of the transistor(s) 740 to other external devices. For example, solder bonds may be formed on the one or more bond pads 736 to mechanically and/or electrically couple a chip including the IC device 700 with another component (e.g., a circuit board). The IC device 700 may have other alternative configurations to route the electrical signals from the interconnect layers 706-710 than depicted in other embodiments. For example, the bond pads 736 may be replaced by or may further include other analogous features (e.g., posts) that route the electrical signals to external components.

FIG. 8 is a cross-sectional side view of an IC device assembly 800 that may include any of the embodiments of the package substrates disclosed herein. The IC device assembly 800 includes a number of components disposed on a circuit board 802. The IC device assembly 800 may include components disposed on a first face 840 of the circuit board 802 and an opposing second face 842 of the circuit board 802; generally, components may be disposed on one or both faces 840 and 842.

In some embodiments, the circuit board 802 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 802. In other embodiments, the circuit board 802 may be a non-PCB substrate.

The IC device assembly 800 illustrated in FIG. 8 includes a package-on-interposer structure 836 coupled to the first face 840 of the circuit board 802 by coupling components 816. The coupling components 816 may electrically and mechanically couple the package-on-interposer structure 836 to the circuit board 802, and may include solder balls (as shown in FIG. 8), male and female portions of a socket, an adhesive, an underfill material, and/or any other suitable electrical and/or mechanical coupling structure.

The package-on-interposer structure 836 may include an IC package 820 coupled to an interposer 804 by coupling components 818. The coupling components 818 may take any suitable form for the application, such as the forms discussed above with reference to the coupling components 816. For example, the coupling components 818 may be second level interconnects. Although a single IC package 820 is shown in FIG. 8, multiple IC packages may be coupled to the interposer 804; indeed, additional interposers may be coupled to the interposer 804. The interposer 804 may provide an intervening substrate used to bridge the circuit board 802 and the IC package 820. The IC package 820 may be or include, for example, a die (the die 705 of FIG. 7B), an IC device (e.g., the IC device 700 of FIG. 7C), or any other suitable component. In particular, the IC package 820 may take any of the embodiments of the IC package substrates disclosed herein, and may include a package substrate with an internal ground plane, microstrip circuitry as the top metallization layer and an external ground plane electrically connected to the internal ground plane. Generally, the interposer 804 may spread a connection to a wider pitch or reroute a connection to a different connection. For example, the interposer 804 may couple the IC package 820 (e.g., a die) to a ball grid array (BGA) of the coupling components 816 for coupling to the circuit board 802. In the embodiment illustrated in FIG. 8, the IC package 820 and the circuit board 802 are attached to opposing sides of the interposer 804; in other embodiments, the IC package 820 and the circuit board 802 may be attached to a same side of the interposer 804. In some embodiments, three or more components may be interconnected by way of the interposer 804.

The interposer 804 may be formed of an epoxy resin, a fiberglass-reinforced epoxy resin, a ceramic material, or a polymer material such as polyimide. In some embodiments, the interposer 804 may be formed of alternate rigid or flexible materials that may include the same materials used in a semiconductor substrate, such as silicon, germanium, and other group III-V and group IV materials. The interposer 804 may include metal interconnects 808 and vias 810, including but not limited to through-silicon vias (TSVs) 806. The interposer 804 may further include embedded devices 814, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 804. The package-on-interposer structure 836 may take the form of any of the package-on-interposer structures known in the art.

The IC device assembly 800 may include an IC package 824 coupled to the first face 840 of the circuit board 802 by coupling components 822. The coupling components 822 may take the form of any of the embodiments discussed above with reference to the coupling components 816, and the IC package 824 may take the form of any of the embodiments discussed above with reference to the IC package 820. In particular, the IC package 824 may take the form of any of the embodiments of the IC package disclosed herein, and may include a package substrate with an internal ground plane, microstrip circuitry as the top metallization layer and an external ground plane electrically connected to the internal ground plane.

The IC device assembly 800 illustrated in FIG. 8 includes a package-on-package structure 834 coupled to the second face 842 of the circuit board 802 by coupling components 828. The package-on-package structure 834 may include an IC package 826 and an IC package 832 coupled together by coupling components 830 such that the IC package 826 is disposed between the circuit board 802 and the IC package 832. The coupling components 828 and 830 may take the form of any of the embodiments of the coupling components 816 discussed above, and the IC packages 826 and 832 may take the form of any of the embodiments of the IC package 820 discussed above. In particular, the IC packages 826 and 832 may take any of the embodiments of the IC package substrate with an internal ground plane, microstrip circuitry as the top metallization layer and an external ground plane electrically connected to the internal ground plane disclosed herein.

FIG. 9 is a block diagram of an example computing device 900 that may include one or more of the package substrates disclosed herein. For example, any suitable ones of the components of the computing device 900 may include, or be included in, an IC package having a package substrate with an internal ground plane, microstrip circuitry as the top metallization layer and an external ground plane electrically connected to the internal ground plane, in accordance with any of the embodiments disclosed herein. A number of components are illustrated in FIG. 9 as included in the computing device 900, but any one or more of these components may be omitted or duplicated, as suitable for the application. In some embodiments, some or all of the components included in the computing device 900 may be attached to one or more motherboards. In some embodiments, some or all of these components are fabricated onto a single system-on-a-chip (SoC) die.

Additionally, in various embodiments, the computing device 900 may include interface circuitry for coupling to the one or more components. For example, the computing device 900 may not include a display device 906, but may include display device interface circuitry (e.g., a connector and driver circuitry) to which a display device 906 may be coupled. In another set of examples, the computing device 900 may not include an audio input device 924 or an audio output device 908, but may include audio input or output device interface circuitry (e.g., connectors and supporting circuitry) to which an audio input device 924 or audio output device 908 may be coupled.

The computing device 900 may include a processing device 902 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 902 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 900 may include a memory 904, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 904 may include memory that shares a die with the processing device 902. This memory may be used as cache memory and may include embedded dynamic random access memory (eDRAM) or spin transfer torque magnetic random-access memory (STT-M RAM).

In some embodiments, the computing device 900 may include a communication chip 912 (e.g., one or more communication chips). For example, the communication chip 912 may be configured for managing wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 912 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 912 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 912 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 912 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 912 may operate in accordance with other wireless protocols in other embodiments. The computing device 900 may include an antenna 922 to facilitate wireless communications and/or to receive other wireless communications (such as AM or FM radio transmissions).

In some embodiments, the communication chip 912 may manage wired communications, such as electrical, optical, or any other suitable communication protocols (e.g., the Ethernet). As noted above, the communication chip 912 may include multiple communication chips. For instance, a first communication chip 912 may be dedicated to shorter-range wireless communications such as Wi-Fi or Bluetooth, and a second communication chip 912 may be dedicated to longer-range wireless communications such as GPS, EDGE, GPRS, CDMA, WiMAX, LTE, EV-DO, or others. In some embodiments, a first communication chip 912 may be dedicated to wireless communications, and a second communication chip 912 may be dedicated to wired communications.

The computing device 900 may include battery/power circuitry 914. The battery/power circuitry 914 may include one or more energy storage devices (e.g., batteries or capacitors) and/or circuitry for coupling components of the computing device 900 to an energy source separate from the computing device 900 (e.g., AC line power).

The computing device 900 may include a display device 906 (or corresponding interface circuitry, as discussed above). The display device 906 may include any visual indicators, such as a heads-up display, a computer monitor, a projector, a touchscreen display, a liquid crystal display (LCD), a light-emitting diode display, or a flat panel display, for example.

The computing device 900 may include an audio output device 908 (or corresponding interface circuitry, as discussed above). The audio output device 908 may include any device that generates an audible indicator, such as speakers, headsets, or earbuds, for example.

The computing device 900 may include an audio input device 924 (or corresponding interface circuitry, as discussed above). The audio input device 924 may include any device that generates a signal representative of a sound, such as microphones, microphone arrays, or digital instruments (e.g., instruments having a musical instrument digital interface (MIDI) output).

The computing device 900 may include a global positioning system (GPS) device 918 (or corresponding interface circuitry, as discussed above). The GPS device 918 may be in communication with a satellite-based system and may receive a location of the computing device 900, as known in the art.

The computing device 900 may include an other output device 910 (or corresponding interface circuitry, as discussed above). Examples of the other output device 910 may include an audio codec, a video codec, a printer, a wired or wireless transmitter for providing information to other devices, or an additional storage device.

The computing device 900 may include an other input device 920 (or corresponding interface circuitry, as discussed above). Examples of the other input device 920 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 900 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 900 may be any other electronic device that processes data.

The following examples pertain to further embodiments. The various features of the different embodiments may be variously combined with some features included and others excluded to suit a variety of different applications.

Example 1 is an integrated circuit package, including: a package substrate, the package substrate, including: an internal ground layer; and a microstrip signal layer, wherein the microstrip signal layer is the uppermost metallization layer of the package substrate; and an external ground plane, wherein the external ground plane is electrically connected to the internal ground layer.

Example 2 may include the subject matter of Example 1, and may further specify that the external ground plane material comprises one or more of copper, stainless steel, beryllium, molybdenum, tungsten, silicon carbide, and tungsten carbide.

Example 3 may include the subject matter of any of Examples 1-2, and may further specify that the external ground plane is a metal stiffener.

Example 4 may include the subject matter of any of Examples 1-3, and may further specify that the external ground plane covers the entire exposed surface of the package substrate.

Example 5 may include the subject matter of any of Examples 1-3, and may further specify that the external ground plane covers a portion of the exposed surface of the package substrate.

Example 6 may include the subject matter of Example 5, and may further specify that the line geometry of the microstrip signal layer changes to match the impedance values of areas covered by the external ground plane with the impedance values of areas not covered by the external ground plane.

Example 7 may include the subject matter of Example 6, and may further specify that the line geometry of the microstrip signal layer is more narrow in areas covered by the external ground plane as compared to areas not covered by the external ground plane.

Example 8 may include the subject matter of any of Examples 1-7, and may further specify that one or more vias form the electrical connection between the external ground plane and the internal ground layer.

Example 9 may include the subject matter of any of Examples 1-8, and may further include a die, first level interconnects, and second level interconnects.

Example 10 may include the subject matter of any of Examples 1-9, and may further specify that the package substrate layer include a dielectric layer on the internal ground layer.

Example 11 may include the subject matter of any of Examples 1-10, and may further specify that the package substrate includes a solder resist layer on the microstrip layer.

Example 12 is a method for fabricating an integrated circuit package, the method including: forming a package substrate, the method of forming the package substrate including: forming an internal ground layer; forming a microstrip signal layer, wherein the microstrip signal layer is the uppermost metallization layer of the package substrate; and attaching an external ground plane to the top surface of the package substrate; and forming an electrical connection between the external ground plane and the internal ground layer through the layers of the package substrate.

Example 13 may include the subject matter of Example 12, and may further specify that forming the package substrate further includes forming a dielectric layer on the internal ground layer.

Example 14 may include the subject matter of Example 13, and may further specify that forming the package substrate further includes forming the microstrip layer on the dielectric layer.

Example 15 may include the subject matter of any of Examples 12-14, and may further specify that forming the package substrate further includes forming a solder resist layer on the microstrip signal layer.

Example 16 may include the subject matter of Example 15, and may further include: forming first level interconnects on the solder resist layer; and connecting a die to the first level interconnects.

Example 17 may include the subject matter of any of Examples 12-16, and may further specify that the external ground plane material comprises one or more of copper, stainless steel, beryllium, molybdenum, tungsten, silicon carbide, and tungsten carbide.

Example 18 may include the subject matter of any of Examples 12-17, and may further specify that the external ground plane is a metal stiffener.

Example 19 may include the subject matter of any of Examples 12-18, and may further specify that the external ground plane covers the entire exposed surface of the package substrate.

Example 20 may include the subject matter of any of Examples 12-18, and may further specify that the external ground plane covers a portion of the exposed surface of the package substrate.

Example 21 may include the subject matter of Example 20, and may further specify that the line geometry of the microstrip signal layer changes to match the impedance values of areas covered by the external ground plane with the impedance values of areas not covered by the external ground plane.

Example 22 may include the subject matter of Example 21, and may further specify that forming the microstrip signal layer further includes: narrowing microstrip line widths to match impedance values in areas covered by the external ground plane with impedance values in areas not covered by the external ground plane.

Example 23 may include the subject matter of any of Examples 12-22, and may further specify that one or more vias form the electrical connection between the external ground plane and the internal ground layer.

Example 24 is a computing device, including: a circuit board; and an integrated circuit package coupled to the circuit board, wherein the integrated circuit package includes: a package substrate, the package substrate including: an internal ground layer; a microstrip signal layer, wherein the microstrip signal layer is the uppermost metallization layer of the package substrate; and an external ground plane, wherein the external ground plane is electrically connected to the internal ground layer.

Example 25 may include the subject matter of Example 24, and may further specify that the external ground plane material comprises one or more of copper, stainless steel, beryllium, molybdenum, tungsten, silicon carbide, and tungsten carbide.

Example 26 may include the subject matter of any of Examples 24-25, and may further specify that the external ground plane is a metal stiffener.

Example 27 may include the subject matter of any of Examples 24-26, and may further specify that the external ground plane covers the entire exposed surface of the package substrate.

Example 28 may include the subject matter of any of Examples 24-26, and may further specify that the external ground plane covers a portion of the exposed surface of the package substrate.

Example 29 may include the subject matter of Example 28, and may further specify that the line geometry of the microstrip signal layer changes to match the impedance values of areas covered by the external ground plane with the impedance values of areas not covered by the external ground plane.

Example 30 may include the subject matter of Example 29, and may further specify that the line geometry of the microstrip signal layer is more narrow in areas covered by the external ground plane as compared to areas not covered by the external ground plane.

Example 31 may include the subject matter of any of Examples 24-30, and may further specify that one or more vias form the electrical connection between the external ground plane and the internal ground layer.

Example 32 may include the subject matter of any of Examples 24-31, and may further include a die; first level interconnects; and second level interconnects.

Example 33 may include the subject matter of any of Examples 24-32, and may further specify that the package substrate further include a dielectric layer on the internal ground layer.

Example 34 may include the subject matter of any of Examples 24-33, and may further specify that the package substrate further include a solder resist layer on the microstrip layer.

Example 35 is package substrate, including: an internal ground layer; a microstrip signal layer, wherein the microstrip signal layer is the uppermost metallization layer of the package substrate; and an external ground plane, wherein the external ground plane is electrically connected to the internal ground layer.

Example 36 may include the subject matter of Example 35, and may further specify that the external ground plane material comprises one or more of copper, stainless steel, beryllium, molybdenum, tungsten, silicon carbide, and tungsten carbide.

Example 37 may include the subject matter of any of Examples 35-36, and may further specify that the external ground plane is a metal stiffener.

Example 38 may include the subject matter of any of Examples 35-37, and may further specify that the external ground plane covers the entire exposed surface of the package substrate.

Example 39 may include the subject matter of any of Examples 35-37, and may further specify that the external ground plane covers a portion of the exposed surface of the package substrate.

Example 40 may include the subject matter of Example 39, and may further specify that the line geometry of the microstrip signal layer changes to match the impedance values of areas covered by the external ground plane with the impedance values of areas not covered by the external ground plane.

Example 41 may include the subject matter of Example 40, and may further specify that the line geometry of the microstrip signal layer is more narrow in areas covered by the external ground plane as compared to areas not covered by the external ground plane.

Example 42 may include the subject matter of any of Examples 35-41, and may further specify that one or more vias form the electrical connection between the external ground plane and the internal ground layer.

The invention claimed is:

1. An integrated circuit package comprising:
    a package substrate having a surface including a die attaching area and a non-die attaching area, the package substrate comprising:
    an internal ground layer, and
    a microstrip signal layer, wherein the microstrip signal layer is the uppermost metallization layer at the surface of the package substrate, and
    an external ground plane on the surface of the package substrate, wherein the external ground plane is on the non-die attaching area, and wherein the external ground plane is electrically connected to the internal ground layer.

2. The integrated circuit package of claim 1, wherein the external ground plane material comprises one or more of copper, stainless steel, beryllium, molybdenum, tungsten, silicon carbide, and tungsten carbide.

3. The integrated circuit package of claim 1, wherein the external ground plane is a metal stiffener.

4. The integrated circuit package of claim 1, wherein the external ground plane entirely covers the non-die attaching area on the surface of the package substrate.

5. The integrated circuit package of claim 1, wherein the external ground plane covers a portion of the exposed surface of the package substrate.

6. The integrated circuit package of claim 5, wherein the line geometry of the microstrip signal layer changes to match the impedance values of areas covered by the external ground plane with the impedance values of areas not covered by the external ground plane.

7. The integrated circuit package of claim 1, wherein the line geometry of the microstrip signal layer has a first width in a first area covered by the external ground plane and a second width that is different from the first width in a second area not covered by the external ground plane.

8. The integrated circuit package of claim 1, wherein one or more vias form the electrical connection between the external ground plane and the internal ground layer.

9. The integrated circuit package of claim 1, the integrated circuit package further comprising:

a die;

first level interconnects; and second level interconnects.

10. The integrated circuit package of claim 1, wherein the package substrate further comprises:

a dielectric layer on the internal ground layer.

11. The integrated circuit package of claim 1, wherein the package substrate further comprises:

a solder resist layer on the microstrip signal layer.

12. A package substrate having a surface including a die attaching area and a non-die attaching area, the package substrate comprising:

an internal ground layer, a microstrip signal layer, wherein the microstrip signal layer is the uppermost metallization layer at the surface of the package substrate, and an external ground plane on the surface of the package substrate, wherein the external ground plane is on the non-die attaching area, and, wherein the external ground plane is electrically connected to the internal ground layer.

13. The package substrate of claim 12, wherein the external ground plane is a metal stiffener.

* * * * *